United States Patent
Alvarez, Jr. et al.

(10) Patent No.: US 10,150,048 B2
(45) Date of Patent: *Dec. 11, 2018

(54) METHOD, SYSTEM, AND DEVICE FOR DELIVERY OF PROCESS GAS

(71) Applicant: RASIRC, Inc., San Diego, CA (US)

(72) Inventors: Daniel Alvarez, Jr., Oceanside, CA (US); Russell J. Holmes, San Diego, CA (US); Jeffrey J. Spiegelman, San Diego, CA (US); Edward Heinlein, San Diego, CA (US); Christopher Ramos, Bonita, CA (US); Jeremiah Trammel, San Diego, CA (US)

(73) Assignee: Rasirc, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/487,924

(22) Filed: Apr. 14, 2017

(65) Prior Publication Data

US 2017/0216738 A1   Aug. 3, 2017

Related U.S. Application Data

(63) Continuation-in-part of application No. PCT/US2015/056887, filed on Oct. 22, 2015.

(60) Provisional application No. 62/067,901, filed on Oct. 23, 2014, provisional application No. 62/190,578, (Continued)

(51) Int. Cl.
| | | |
|---|---|---|
| *B01D 19/00* | (2006.01) | |
| *B01B 1/00* | (2006.01) | |
| *C23C 16/455* | (2006.01) | |
| *C01B 15/017* | (2006.01) | |
| *C23C 16/448* | (2006.01) | |

(52) U.S. Cl.
CPC .......... *B01B 1/005* (2013.01); *B01D 19/0031* (2013.01); *B01D 19/0068* (2013.01); *B01D 19/0073* (2013.01); *C01B 15/017* (2013.01); *C23C 16/448* (2013.01)

(58) Field of Classification Search
CPC ............ B01D 19/0031; B01D 19/0068; B01D 19/0073; B01D 53/22; A61L 2/186; A61L 2/208; C01B 15/017; B01B 1/005; C23C 16/448
See application file for complete search history.

(56) References Cited

U.S. PATENT DOCUMENTS

| | | | |
|---|---|---|---|
| 2,785,052 A | * | 3/1957 | Osborg ................... C01B 21/16 423/407 |
| 2,865,714 A | | 12/1958 | Robell et al. |
| 3,557,009 A | | 1/1971 | McCloskey et al. |

(Continued)

FOREIGN PATENT DOCUMENTS

| | | |
|---|---|---|
| WO | 2001/047805 A1 | 7/2001 |
| WO | 2006/117328 A1 | 11/2006 |

(Continued)

OTHER PUBLICATIONS

PCT/US2017/027634 ISR and WO dated Jul. 6, 2017.
PCT/US2015/056887 ISR and WO dated Feb. 10, 2016.
PCT/US2013/031519 ISR and WO dated Jun. 14, 2013.

*Primary Examiner* — Jason M Greene
(74) *Attorney, Agent, or Firm* — Wagenknecht IP Law Group, PC

(57) ABSTRACT

Provided herein are methods, systems, and devices for the vapor phase delivery of high purity process gases to a critical process or application.

15 Claims, 17 Drawing Sheets

Related U.S. Application Data filed on Jul. 9, 2015, provisional application No. 62/323,697, filed on Apr. 16, 2016.

(56) References Cited

U.S. PATENT DOCUMENTS

| | | | |
|---|---|---|---|
| 3,750,735 A | 8/1973 | Chiang et al. | |
| 4,806,245 A | 2/1989 | Boddeker | |
| 4,826,681 A * | 5/1989 | Jacquet | A61K 8/22 424/613 |
| 4,909,810 A | 3/1990 | Nakao et al. | |
| 5,013,436 A | 5/1991 | Lee et al. | |
| 5,649,996 A | 7/1997 | Soffer et al. | |
| 5,910,448 A | 6/1999 | Atwater et al. | |
| 5,928,409 A | 7/1999 | Sirkar | |
| 9,410,191 B2 | 8/2016 | Alvarez, Jr. et al. | |
| 9,545,585 B2 * | 1/2017 | Alvarez, Jr. | B01D 19/0068 |
| 9,610,550 B2 | 4/2017 | Alvarez, Jr. et al. | |
| 9,932,630 B2 | 4/2018 | Alvarez, Jr. et al. | |
| 2002/0144887 A1 | 10/2002 | Ricard | |
| 2002/0192938 A1 | 12/2002 | Wada et al. | |
| 2003/0105356 A1 | 6/2003 | Schiffer et al. | |
| 2004/0062693 A1 * | 4/2004 | Lin | A61L 2/208 422/297 |
| 2004/0079491 A1 | 4/2004 | Harris et al. | |
| 2005/0193758 A1 | 9/2005 | Wells | |
| 2006/0021615 A1 | 2/2006 | Kertzman | |
| 2007/0180988 A1 | 8/2007 | Bronold | |
| 2007/0187320 A1 | 8/2007 | Mabuchi et al. | |
| 2007/0199891 A1 | 8/2007 | Mabuchi et al. | |
| 2008/0237057 A1 | 10/2008 | Li et al. | |
| 2009/0014901 A1 * | 1/2009 | Spiegelman | B01B 1/005 261/128 |
| 2009/0145831 A1 | 6/2009 | Manabe et al. | |
| 2009/0188863 A1 | 7/2009 | Knapp et al. | |
| 2009/0263499 A1 * | 10/2009 | Platt, Jr. | A61L 2/208 424/616 |
| 2010/0024816 A1 | 2/2010 | Weinstein et al. | |
| 2010/0034697 A1 | 2/2010 | Weinberger et al. | |
| 2010/0117246 A1 | 5/2010 | Sarigiannis et al. | |
| 2010/0275629 A1 | 11/2010 | Erickson | |
| 2011/0076192 A1 | 3/2011 | Robitaille et al. | |
| 2013/0199220 A1 | 8/2013 | Ma et al. | |
| 2014/0014138 A1 | 1/2014 | Spiegelman et al. | |
| 2015/0068611 A1 * | 3/2015 | Alvarez, Jr. | B01D 53/228 137/13 |
| 2015/0190736 A1 | 7/2015 | Alvarez, Jr. et al. | |
| 2015/0329901 A1 | 11/2015 | Rasirc et al. | |
| 2016/0051928 A1 * | 2/2016 | Spiegelman | B01D 53/228 137/1 |
| 2017/0216738 A1 | 8/2017 | Alvarez, Jr. et al. | |
| 2017/0239592 A1 * | 8/2017 | Spiegelman | B01D 63/068 |
| 2017/0369315 A1 * | 12/2017 | Alvarez, Jr. | B01D 19/0031 |

FOREIGN PATENT DOCUMENTS

| | | | |
|---|---|---|---|
| WO | 2012/024131 A2 | 2/2012 | |
| WO | 2013/148262 A1 | 10/2013 | |
| WO | 2014/014511 A1 | 1/2014 | |
| WO | WO 2014/014511 A1 * | 1/2014 | C01B 15/017 |
| WO | 2016/065132 A1 | 4/2016 | |
| WO | 2017181013 A1 | 10/2017 | |

* cited by examiner

METHOD, SYSTEM, AND DEVICE FOR DELIVERY OF PROCESS GAS

CROSS REFERENCE TO RELATED APPLICATION(S)

This application is a continuation-in-part of International Application No. PCT/US2015/056887, filed Oct. 22, 2015, which claims the benefit of priority under 35 U.S.C. § 119(e) of U.S. Ser. No. 62/067,901, filed Oct. 23, 2014, and to U.S. Ser. No. 62/190,578, filed Jul. 9, 2015. This application also claims the benefit of priority under 35 U.S.C. § 119(e) of U.S. Ser. No. 62/323,697, filed Apr. 16, 2016. The entire content of each of these applications is incorporated herein by reference.

TECHNICAL FIELD

Methods, systems, and devices for the vapor phase delivery of high purity process gases in micro-electronics and other critical process applications.

BACKGROUND

Various process gases may be used in the manufacturing and processing of micro-electronics. In addition, a variety of chemicals may be used in other environments demanding high purity gases, e.g., critical processes or applications, including without limitation microelectronics applications, wafer cleaning, wafer bonding, photoresist stripping, silicon oxidation, surface passivation, photolithography mask cleaning, atomic layer deposition, chemical vapor deposition, flat panel displays, disinfection of surfaces contaminated with bacteria, viruses and other biological agents, industrial parts cleaning, pharmaceutical manufacturing, production of nano-materials, power generation and control devices, fuel cells, power transmission devices, and other applications in which process control and purity are critical considerations. In those processes and applications, it is necessary to deliver specific amounts of certain process gases under controlled operating conditions, e.g., temperature, pressure, and flow rate.

For a variety of reasons, gas phase delivery of process chemicals is preferred to liquid phase delivery. For applications requiring low mass flow for process chemicals, liquid delivery of process chemicals is not accurate or clean enough. Gaseous delivery would be desired from a standpoint of ease of delivery, accuracy and purity. Gas flow devices are better attuned to precise control than liquid delivery devices. Additionally, micro-electronics applications and other critical processes typically have extensive gas handling systems that make gaseous delivery considerably easier than liquid delivery. One approach is to vaporize the process chemical component directly at or near the point of use. Vaporizing liquids provides a process that leaves heavy contaminants behind, thus purifying the process chemical. However, for safety, handling, stability, and/or purity reasons, many process gases are not amenable to direct vaporization.

There are numerous process gases used in micro-electronics applications and other critical processes or applications. Ozone is a gas that is typically used to clean the surface of semiconductors (e.g., photoresist stripping) and as an oxidizing agent (e.g., forming oxide or hydroxide layers). One advantage of using ozone gas in micro-electronics applications and other critical processes, as opposed to prior liquid-based approaches, is that gases are able to access high aspect ratio features on a surface. For example, according to the International Technology Roadmap for Semiconductors (ITRS), current semiconductor processes should be compatible with a half-pitch as small as 20-22 nm. The next technology node for semiconductors is expected to have a half-pitch of 10 nm, and the ITRS calls for <7 nm half-pitch in the near future. At these dimensions, liquid-based chemical processing is not feasible, because the surface tension of the process liquid prevents it from accessing the bottom of deep holes or channels and the corners of high aspect ratio features. Therefore, ozone gas has been used in some instances to overcome certain limitations of liquid-based processes, because gases do not suffer from the same surface tension limitations. Plasma-based processes have also been employed to overcome certain limitations of liquid-based processes. However, ozone- and plasma-based processes present their own set of limitations, including, inter alia, cost of operation, insufficient process controls, undesired side reactions, and inefficient cleaning.

Other problems relate to the temperature necessary for successful deposition. With respect to silicon nitride (SiN) for example, ammonia ($NH_3$) is currently often used at temperatures in excess of 500° C. or even 600° C. It is expensive to maintain such high temperatures for deposition and it would be preferable to deposit at lower temperatures. In addition, new semiconductor device technologies have stringent thermal budgets, which inhibit the use of elevated temperatures over 400° C. Hydrazine ($N_2H_4$) presents an opportunity to explore lower temperatures in part because of the favorable thermodynamics of hydrazine resulting in lower deposition temperatures and a spontaneous reaction to form nitrides. Although reported in the literature (Burton et al. *J. Electrochem. Soc.*, 155(7) D508-D516 (2008)), hydrazine usage has not been adopted commercially due to the serious safety concerns with using hydrazine. Substituted hydrazines, which are generally safer than hydrazine, suffer from the drawback of leading to unwanted carbon contamination. Thus, there is a need to develop a safer method for using hydrazine for either deposition processes or for delivery to other critical process applications.

The gas phase use of hydrazine has been limited by safety, handling, and purity concerns. Hydrazine has been used for rocket fuel and can be very explosive. Anhydrous hydrazine has a low flash point of about 37° C. Semiconductor industry protocol for safe handling of this material is very limited. Therefore, a technique is needed to overcome these limitations and, specifically, to provide substantially water-free gaseous hydrazine suitable for use in micro-electronics and other critical process applications.

Similarly, as explained in PCT Publication No. 2014014511 by Rasirc, Inc., which is hereby incorporated by reference herein, the gas phase use of hydrogen peroxide in critical process applications has been of limited utility, because highly concentrated hydrogen peroxide solutions present serious safety and handling concerns and obtaining high concentrations of hydrogen peroxide in the gas phase has not been possible using existing technology.

SUMMARY OF CERTAIN EMBODIMENTS

Methods, systems, and devices for delivering a substantially water-free process gas stream, particularly a hydrazine-containing gas stream, are provided. The methods, systems, and devices are particularly useful in micro-electronics applications and other critical processes. Generally, the methods comprise (a) providing a non-aqueous hydrazine solution having a vapor phase comprising an amount of hydrazine vapor; (b) contacting a carrier gas or vacuum with the vapor phase; and (c) delivering a gas stream comprising substantially water-free hydrazine to a critical process or application. In many embodiments, the amount of hydrazine in the vapor phase is sufficient to provide hydrazine directly to a critical process or application without further concentrating or processing the hydrazine-containing gas stream. In many embodiments, the non-aqueous hydrazine solution includes a stabilizer. In certain embodiments, the methods further include removing one or more stabilizers from the gas stream. By adjusting the operating conditions of the methods, e.g., the temperature and pressure of the carrier gas or vacuum, the concentration of the hydrazine solution, and the temperature and pressure of the hydrazine solution, hydrazine can be precisely and safely delivered as a process gas. In certain embodiments, the amount of hydrazine in the vapor phase and delivered to the critical process or application can be controlled by adding energy to the hydrazine solution, e.g., thermal energy, rotational energy, or ultrasonic energy. In many embodiments of the invention, the non-aqueous hydrazine is neat hydrazine or hydrazine that is substantially free of water.

Systems and devices for delivering hydrazine using the methods described herein are also provided. Generally, the systems and devices comprise (a) a non-aqueous hydrazine solution having a vapor phase comprising an amount of hydrazine vapor; (b) a carrier gas or vacuum in fluid contact with the vapor phase; and (c) an apparatus for delivering a gas stream comprising hydrazine to a critical process or application. In many embodiments, the non-aqueous hydrazine solution includes one or more stabilizers. In certain embodiments, the systems and devices further include an apparatus for removing one or more stabilizers from the gas stream. In many embodiments, the amount of hydrazine in the vapor phase is sufficient to provide hydrazine directly to a critical process or application without further concentrating or processing the hydrazine-containing gas stream. In certain embodiments, the apparatus for delivering a gas stream comprising hydrazine is an outlet of a head space, containing the vapor phase, that is connected directly or indirectly to a micro-electronics application or other critical process system, allowing the hydrazine containing gas stream to flow from the head space to the application or process in which it will be used. The hydrazine delivery assembly (HDA) described herein is one such device. By adjusting the operating conditions of the systems and devices, e.g., the temperature and pressure of the carrier gas or vacuum, the concentration of the hydrazine solution, and the temperature and pressure of the hydrazine solution, hydrazine can be precisely and safely delivered as a process gas. In certain embodiments, the amount of hydrazine in the vapor phase and delivered to the critical process or application can be controlled by adding energy to the hydrazine solution, e.g., thermal energy, rotational energy, or ultrasonic energy.

Many of the embodiments of the methods, systems, and devices disclosed herein utilize a membrane in contact with the hydrazine-containing solution. The use of the membrane has safety advantages. In certain embodiments, the membrane wholly or partially separates the hydrazine-containing solution from the hydrazine-containing vapor phase. By eliminating access between the vapor phase and the liquid phase, a sudden decomposition in the vapor phase of the hydrazine would be limited and not cause a corresponding decomposition in the liquid phase due to the presence of the membrane.

Also disclosed herein are devices for containing a liquid comprising a volatile chemical or chemical composition (e.g., hydrazine, hydrogen peroxide, water, alcohols, amines, or ammonium hydroxide), wherein the device comprises a head space where vapor comprising the chemical or composition is accessible as a process gas to be incorporated into a process gas stream. The process gas stream comprising the chemical or composition is typically delivered to a critical process application. In certain embodiments, the device comprises (a) a chamber containing a liquid comprising a volatile chemical or chemical composition, (b) a head space comprising a vapor phase that includes the volatile chemical or chemical composition in the gas phase, (c) a inlet port through which a carrier gas stream can enter the chamber, and (d) a protected outlet port through which a process gas stream comprising carrier gas and the volatile chemical or chemical composition can exit the head space. In certain embodiments, the head space is a portion of the chamber. In certain alternative embodiments, the head space is distinct from the chamber and in fluid communication with the chamber to allow the volatile chemical or chemical composition in the gas phase to move from the chamber into head space. In many embodiments, a membrane facilitates the transfer of the volatile chemical or chemical composition from the liquid into the gas phase. The configuration of the membrane may vary according to the particular application and process design. In some embodiments, the membrane wholly or partially separates the liquid from the head space. In certain embodiments, the membrane comprises a tube connected to the inlet port such that all or a portion of the carrier gas travels through the membrane. In such embodiments, the membrane tube may also travel through a portion of the liquid in the chamber and terminate in the head space. The protected outlet port comprises an apparatus to ensure that the volatile chemical or chemical composition entering the exit port is substantially in the gas phase, i.e., substantially free of liquid phase material, such as droplets, mists, or fogs.

The methods, systems, and devices described herein are generally applicable to a wide variety of process gas streams, particularly non-aqueous hydrazine solutions wherein the hydrazine solutions contain non-aqueous components.

In certain embodiments, the solution comprises substantially pure hydrazine, meaning hydrazine in which no other chemicals are deliberately included but allowing for incidental amounts of impurities. In certain embodiments, the solution comprises from about 5% to about 99% by weight of hydrazine, or from about 90% to about 99%, from about 95% to about 99%, from about 96% to about 99%, from about 97% to about 99%, from about 98% to about 99%, or from about 99% to about 100% by weight of hydrazine, with the remaining components comprising solvents and/or stabilizers. In some embodiments, the solution comprises hydrazine at concentrations greater than 99.9% purity and, in some embodiments, the solution comprises hydrazine at concentrations of greater than 99.99%. Selection of an appropriate non-aqueous hydrazine solution will be determined by the requirements of a particular application or process.

In certain embodiments, the non-aqueous hydrazine solution comprises, in addition to hydrazine, one or more suitable solvents. In one example, the non-aqueous hydrazine solution comprises a glycol solvent, e.g., ethylene glycol, triethylene glycol, □-propylene glycol, and □-propylene glycol. A particular non-aqueous hydrazine solution that is useful in the methods and systems described herein is 65% hydrazine/35% triethylene glycol. In other examples, the non-aqueous hydrazine solution comprises an alcohol amine, such as ethanol amine, diethanol amine, or triethanol amine. In other examples, the non-aqueous hydrazine solution comprises an aprotic amide solvent, e.g., hexamethylphosoramide, 1,3-Dimethyl-3,4,5,6-tetrahydro-2(1H)-pyrimidinone (DMPU), 1,3-Dimethyl-2-imidazolidinone (DMEU), tetramethylurea, or another aprotic urea-based solvent. Another solvent is hexamethylenetetramine. The non-aqueous hydrazine solution may comprise a PEGylated solvent, wherein the PEGylated solvent is a liquid when at a temperature of about 25° C. The term "PEGylated solvent" refers to a solvent containing a covalently attached poly (ethylene glycol) moiety. One exemplary PEGylated solvent is poly(ethylene glycol) dimethyl ether. In some embodiments, the suitable solvent is selected from low molecular weight polymers or oligomers of polyaniline, polypyrrole, polypyridine or polyvinylalchohol. A low molecular weight polymer is one such that when combined with hydrazine, the combined solution has a viscosity of about 35 centipoises (cp) or less. Other examples of solvents include glymes such as monoglyme, diglyme, triglyme, higlyme, and tetraglyme. Those of skill in the art will recognize that other solvents may be useful in the methods, systems, and devices disclosed herein. Criteria for selected an appropriate solvent include miscibility and solubility with hydrazine, chemical compatibility with hydrazine, compatibility with other components of the system (such as a membrane), boiling point of the solvent, flash point of the non-aqueous hydrazine solution, and other safety and handling concerns.

Further examples include a range of PEGylated dimethyl ethers such as Polyglycol DME 200, Polyglycol DME 250, Polyglycol DME 500, Polyglycol DME 1000, or Polyglycol DME 2000. In some embodiments, the non-aqueous hydrazine solution comprises from about 30% to about 69% by weight and ranges in between including between about 65% to about 69% by weight of hydrazine. The remainder of the solution may comprise, for example, one or more PEGylated solvents such as poly(ethylene glycol) dimethyl ether. For instance, the hydrazine solution may comprise from about 32% to 35% by weight of PEGylated solvent such as poly(ethylene glycol) dimethyl ether or other suitable solvents. In other embodiments, less than about 65% hydrazine is used and more than about 35% of a PEGylated solvent such as poly(ethylene glycol) dimethyl ether is used such as Polyglycol DME 250.

The methods, systems, and devices provided herein can employ a variety of membranes. The membrane is typically a selectively permeable membrane, particularly a substantially gas-impermeable membrane, e.g., a perfluorinated ion exchange membrane, such as a NAFION® membrane. In certain embodiments, the NAFION® membrane may be chemically treated e.g., with an acid, base, or salt to modify its reactivity. For example, in certain embodiments, the NAFION® membrane may be treated in a way to form the ammonium species. By using certain selectively permeable membranes, which typically are substantially gas-impermeable membranes and specifically NAFION® membranes and its derivatives, the concentration of the hydrazine gas in the resultant gas stream may be altered relative to the hydrazine concentration that would be obtained directly from the vapor of the hydrazine solution in the absence of a membrane. In certain embodiments, the hydrazine gas concentration is amplified (i.e., higher than) the concentration that would be expected from the vapor of the hydrazine solution absent the membrane. Preferably, the concentration of hydrazine is amplified using the methods, systems, and devices disclosed herein.

In another embodiment, the membrane is a copolymer of tetrafluroethylene and sulfonyl fluoride vinyl ether. One such example of such a membrane can be made from Aquivon® (Solvay S. A., Brussels, Belgium). A specific Aquivon® polymer is known as P98S and is provided as pellets.

The methods, systems, and devices provided herein may further comprise removing one or more components from the hydrazine containing gas stream to produce a purified hydrazine containing gas stream, e.g., using a device that selectively or non-selectively removes components from the gas stream. Preferred devices would be devices that substantially remove a non-reactive process gas from the hydrazine containing gas stream, while the amount of hydrazine in the gas stream is relatively unaffected. For example, a device may remove any non-aqueous solvents or stabilizers from the gas stream, including without limitation any traces of water or non-aqueous solvents. For example, the devices may further comprise a purifier positioned downstream of the head space. Particularly preferred purifier devices are membrane contactors, molecular sieves, activated charcoal and other adsorbents, if they have the desired characteristics to meet the application or process requirements. A preferred characteristic of the gas removal device is the ability to remove certain component(s) in a relatively selective manner while allowing the remaining component(s) to remain in the hydrazine gas stream relatively unaffected.

The systems and devices provided herein may further comprise various components for containing and controlling the flow of the gases and liquids used therein. For example, the systems and devices may further comprise mass flow controllers, valves, check valves, pressure gauges, regulators, rotameters, and pumps. The systems and devices provided herein may further comprise various heaters, thermocouples, and temperature controllers to control the temperature of various components of the devices and steps of the methods.

Additional objects and advantages of the invention will be set forth in part in the description which follows, and in part will be obvious from the description, or maybe learned by practice of the invention. The objects and advantages of the invention will be realized and attained by means of the elements and combinations particularly pointed out in the embodiments and claims.

It is to be understood that both the foregoing general description and the following detailed description are exemplary and explanatory only and are not restrictive of the invention.

The accompanying drawings, which are incorporated in and constitute a part of this specification, illustrate several embodiments of the invention and, together with the description, serve to explain the principles of the invention.

DETAILED DESCRIPTION

Figure 1A:
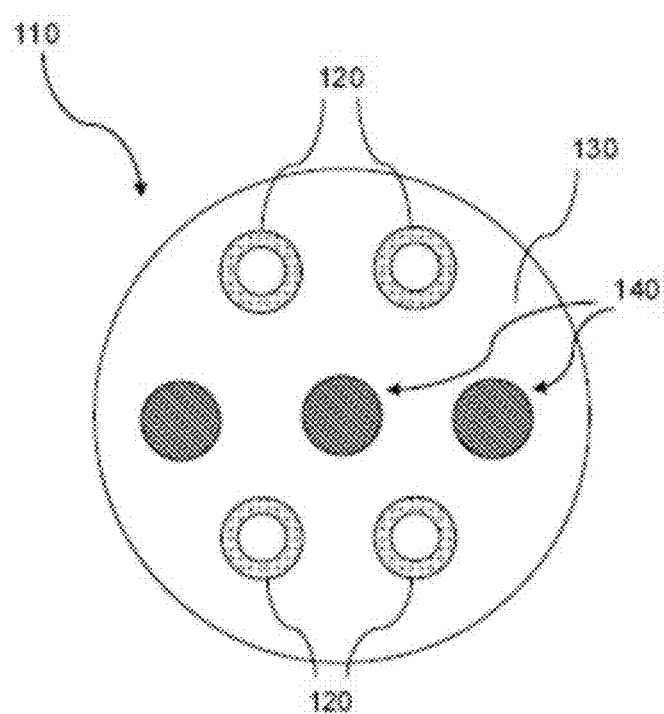
FIG. 1A is a diagram illustrating a part of a membrane assembly useful in certain embodiments of the present invention.

Various embodiments of the invention will now be explained in greater detail. It is to be understood that both the foregoing general description and the following detailed description are exemplary and explanatory only, and are not restrictive of the invention as claimed. Any discussion of certain embodiments or features serves to illustrate certain exemplary aspects of the invention. The invention is not limited to the embodiments specifically discussed herein.

Unless otherwise indicated, all numbers such as those expressing temperatures, weight percents, concentrations, time periods, dimensions, and values for certain parameters or physical properties used in the specification and claims are to be understood as being modified in all instances by the term "about." It should also be understood that the precise numerical values and ranges used in the specification and claims form additional embodiments of the invention. All measurements are subject to uncertainty and experimental variability.

The term "critical process or application" as used herein is a broad term, and is to be given its ordinary and customary meaning to a person of ordinary skill in the art (and is not to be limited to a special or customized meaning), and refers without limitation to a process or application in which process control and purity are critical considerations. Examples of critical processes and applications include without limitation microelectronics applications, wafer cleaning, wafer bonding, photoresist stripping, silicon oxidation, surface passivation, photolithography mask cleaning, atomic layer deposition, chemical vapor deposition, flat panel displays, disinfection of surfaces contaminated with bacteria, viruses and other biological agents, industrial parts cleaning, pharmaceutical manufacturing, production of nano-materials, power generation and control devices, fuel cells, and power transmission devices.

The term "process gas" as used herein is a broad term, and is to be given its ordinary and customary meaning to a person of ordinary skill in the art (and is not to be limited to a special or customized meaning), and refers without limitation to a gas that is used in an application or process, e.g., a step in the manufacturing or processing of micro-electronics and in other critical processes. Exemplary process gases are reducing agents, oxidizing agents, inorganic acids, organic acids, inorganic bases, organic bases, and inorganic and organic solvents. A preferred process gas is hydrazine.

The term "reactive process gas" as used herein is a broad term, and is to be given its ordinary and customary meaning to a person of ordinary skill in the art (and is not to be limited to a special or customized meaning), and refers without limitation to a process gas that chemically reacts in the particular application or process in which the gas is employed, e.g., by reacting with a surface, a liquid process chemical, or another process gas.

The term "non-reactive process gas" as used herein is a broad term, and is to be given its ordinary and customary meaning to a person of ordinary skill in the art (and is not to be limited to a special or customized meaning), and refers without limitation to a process gas that does not chemically react in the particular application or process in which the gas is employed, but the properties of the "non-reactive process gas" provide it with utility in the particular application or process.

The term "carrier gas" as used herein is a broad term, and is to be given its ordinary and customary meaning to a person of ordinary skill in the art (and is not to be limited to a special or customized meaning), and refers without limitation to a gas that is used to carry another gas through a process train, which is typically a train of piping. Exemplary carrier gases are nitrogen, argon, hydrogen, oxygen, CO2, clean dry air, helium, or other gases that are stable at room temperature and atmospheric pressure.

The term "head space" as used herein is a broad term, and is to be given its ordinary and customary meaning to a person of ordinary skill in the art (and is not to be limited to a special or customized meaning), and refers without limitation to a volume of gas in fluid contact with a hydrazine solution that provides at least a portion of the gas contained in the head space. There may be a permeable or selectively permeable barrier wholly or partially separating the head space that is optionally in direct contact with the hydrazine solution. In those embodiments where the membrane is not in direct contact with the hydrazine solution, more than one head space may exist, i.e. a first head space directly above the solution that contains the vapor phase of the solution and a second head space separated from the first head space by a membrane that only contains the components of the first space that can permeate the membrane, e.g., hydrazine. In those embodiments with a hydrazine solution and a head space separated by a substantially gas-impermeable membrane, the head space may be located above, below, or on any side of the hydrazine solution, or the head space may surround or be surrounded by the hydrazine solution. For example, the head space may be the space inside a substantially gas-impermeable tube running through the hydrazine solution or the hydrazine solution may be located inside a substantially gas-impermeable tube with the head space surrounding the outside of the tube.

The term "substantially gas-impermeable membrane" as used herein is a broad term, and is to be given its ordinary and customary meaning to a person of ordinary skill in the art (and is not to be limited to a special or customized meaning), and refers without limitation to a membrane that is relatively permeable to other components that may be present in a gaseous or liquid phase, e.g., hydrazine, but relatively impermeable to other gases such as, but not limited to, hydrogen, nitrogen, oxygen, carbon monoxide, carbon dioxide, hydrogen sulfide, hydrocarbons (e.g., ethylene), volatile acids and bases, refractory compounds, and volatile organic compounds.

The term "ion exchange membrane" as used herein is a broad term, and is to be given its ordinary and customary meaning to a person of ordinary skill in the art (and is not to be limited to a special or customized meaning), and refers without limitation to a membrane comprising chemical groups capable of combining with ions or exchanging with ions between the membrane and an external substance. Such chemical groups include, but are not limited to, sulfonic acid, carboxylic acid, sulfonamide, sulfonyl imide, phosphoric acid, phosphinic acid, arsenic groups, selenic groups, phenol groups, and salts thereof.

The term "permeation rate" as used herein is a broad term, and is to be given its ordinary and customary meaning to a person of ordinary skill in the art (and is not to be limited to a special or customized meaning), and refers without limitation to the rate at which a specific chemical, e.g., hydrazine, or a chemical composition a permeates a membrane. The permeation rate may be expressed as an amount of the chemical or composition of interest that permeates a particular surface area of membrane during a period of time, e.g., liters per minute per square inch (L/min/in$^2$).

The term "non-aqueous solution" or "non-aqueous hydrazine solution" as used herein is a broad term, and is to be given its ordinary and customary meaning to a person of ordinary skill in the art (and is not to be limited to a special or customized meaning), and refers to a solution comprising hydrazine and optionally other components and containing less than 10% by weight of water. Exemplary non-aqueous solutions include those containing less than 2%, 0.5%, 0.1%, 0.01%, 0.001% or less water, which solutions are referred to herein as "anhydrous hydrazine."

The term "stabilizer" as used herein is a broad term, and is to be given its ordinary and customary meaning to a person of ordinary skill in the art (and is not to be limited to a special or customized meaning), and refers to a chemical that prevents the decomposition or reaction of process chemical, such as hydrazine or hydrogen peroxide. In certain embodiments, the stabilizer is non-volatile and is not present in the vapor phase in more than an insubstantial amount. In certain embodiments, the stabilizer can be removed from the process gas stream by exposing the process gas stream to an adsorbent or passing the process gas stream through a cold trap. In certain embodiments that include a membrane separating the non-aqueous hydrazine solution from the vapor phase, the stabilizer may not permeate the membrane.

The methods, systems, and devices disclosed herein provide advantageous delivery of volatile process components to a critical process application. In many embodiments, the methods, systems, and devices disclosed herein are particularly applicable to hydrazine. Certain devices disclosed herein are also applicable to other volatile process components.

In certain embodiments, the advantageous hydrazine delivery provided by the present invention, and specifically the methods, systems, and devices of certain embodiments described herein, may be obtained using a membrane contactor. In a preferred embodiment, a non-porous membrane is employed to provide a barrier between the hydrazine solution and the head space that is in fluid contact with a carrier gas or vacuum. Preferably, hydrazine rapidly permeates across the membrane, while gases are excluded from permeating across the membrane into the solution. In some embodiments the membrane may be chemically treated with an acid, base, or salt to modify the properties of the membrane.

In certain embodiments, the hydrazine is introduced into a carrier gas or vacuum through a substantially gas-impermeable ionic exchange membrane. Gas impermeability can be determined by the "leak rate." The term "leak rate" as used herein is a broad term, and is to be given its ordinary and customary meaning to a person of ordinary skill in the art (and is not to be limited to a specialized or customized meaning), and refers without limitation to the volume of a particular gas that penetrates the membrane surface area per unit of time. For example, a substantially gas-impermeable membrane could have a low leak rate of gases (e.g., a carrier gas) other than a process gas (e.g., hydrazine), such as a leak rate of less than about 0.001 cm3/cm2/s under standard atmospheric temperature and pressure. Alternatively, a substantially gas-impermeable membrane can be identified by a ratio of the permeability of a process gas vapor compared to the permeability of other gases. Preferably, the substantially gas-impermeable membrane is more permeable to such process gases than to other gases by a ratio of at least 10,000:1, such as a ratio of at least about 20,000:1, 30,000:1, 40,000:1, 50,000:1, 60,000:1, 70,000:1, 80,000:1, 90,000:1 or a ratio of at least 100,000:1, 200,000:1, 300,000:1, 400,000:1, 500,000:1, 600,000:1, 700,000:1, 800,000:1, 900,000:1 or even a ratio of at least about 1,000,000:1. However, in other embodiments, other ratios that are less than 10,000:1 can be acceptable, for example 1.5:1, 2:1, 3:1, 4:1, 5:1, 6:1, 7:1, 8:1, 9:1, 10:1; 50:1, 100:1, 500:1, 1,000:1, or 5,000:1 or more.

In certain embodiments, the membrane is an ion exchange membrane, such as a polymer resin containing exchangeable ions. Preferably, the ion exchange membrane is a fluorine-containing polymer, e.g., polyvinylidenefluoride, polytetrafluoroethylene (PTFE), ethylene tetrafluoride-propylene hexafluoride copolymers (FEP), ethylene tetrafluoride-perfluoroalkoxyethylene copolymers (PFE), polychlorotrifluoroethylene (PCTFE), ethylene tetrafluorideethylene copolymers (ETFE), polyvinylidene fluoride, polyvinyl fluoride, vinylidene fluoride-trifluorinated ethylene chloride copolymers, vinylidene fluoride-propylene hexafluoride copolymers, vinylidene fluoridepropylene hexafluoride-ethylene tetrafluoride terpolymers, ethylene tetrafluoridepropylene rubber, and fluorinated thermoplastic elastomers. Alternatively, the resin comprises a composite or a mixture of polymers, or a mixture of polymers and other components, to provide a contiguous membrane material. In certain embodiments, the membrane material can comprise two or more layers. The different layers can have the same or different properties, e.g., chemical composition, porosity, permeability, thickness, and the like. In certain embodiments, it can also be desirable to employ a layer (e.g., a membrane) that provides support to the filtration membrane, or possesses some other desirable property.

The ion exchange membrane is preferably a perfluorinated ionomer comprising a copolymer of ethylene and a vinyl monomer containing an acid group or salts thereof. Exemplary perfluorinated ionomers include, but are not limited to, perfluorosulfonic acid/tetrafluoroethylene copolymers ("PFSA-TFE copolymer") and perfluorocarboxylic acid/tetrafluoroethylene copolymer ("PFCA-TFE copolymer"). These membranes are commercially available under the tradenames NAFION® (E.I. du Pont de Nemours & Company), 3M Ionomer (Minnesota Mining and Manufacturing Co.), FLEMION® (Asashi Glass Company, Ltd.), and ACIPLEX® (Asashi Chemical Industry Company), and Aquivon® (Solvay).

In preparing a hydrazine containing gas stream, a hydrazine solution can be passed through the membrane. The term "passing a hydrazine solution through a membrane" as used herein is a broad term, and is to be given its ordinary and customary meaning to a person of ordinary skill in the art (and is not to be limited to a special or customized meaning), and refers without limitation to contacting a first side of a membrane with the hydrazine solution, such that the hydrazine passes through the membrane, and obtaining a hydrazine containing gas stream on the opposite side of the membrane. The first and second sides can have the form of substantially flat, opposing planar areas, where the membrane is a sheet. Membranes can also be provided in tubular or cylindrical form where one surface forms the inner position of the tube and an opposing surface lies on the outer surface. The membrane can take any form, so long as the first surface and an opposing second surface sandwich a bulk of the membrane material. Depending on the processing conditions, nature of the hydrazine solution, volume of the hydrazine solution's vapor to be generated, and other factors, the properties of the membrane can be adjusted. Properties include, but are not limited to physical form (e.g., thickness, surface area, shape, length and width for sheet form, diameter if in fiber form), configuration (flat sheet(s), spiral or rolled sheet(s), folded or crimped sheet(s), fiber array(s)), fabrication method (e.g., extrusion, casting from solution), presence or absence of a support layer, presence or absence of an active layer (e.g., a porous prefilter to adsorb particles of a particular size, a reactive prefilter to remove impurities via chemical reaction or bonding), and the like. It is generally preferred that the membrane be from about 0.5 microns in thickness or less to 2000 microns in thickness or more, preferably from about 1, 5, 10, 25, 50, 100, 200, 300, 400, or 500 microns to about 600, 700, 800, 900, 1000, 1100, 1200, 1300, 1400, 1500, 1600, 1700, 1800, or 1900 microns. When thinner membranes are employed, it can be desirable to provide mechanical support to the membrane (e.g., by employing a supporting membrane, a screen or mesh, or other supporting structure), whereas thicker membranes may be suitable for use without a support. The surface area can be selected based on the mass of vapor to be produced.

Certain embodiments of the methods, systems, and devices provided herein, in which a carrier gas or vacuum can be used to deliver substantially water-free hydrazine, are shown by reference to the Figures.

According to certain embodiments of the present invention, a hydrazine delivery assembly (HDA) is provided. An HDA is a device for delivering hydrazine into a process gas stream, e.g., a carrier gas used in a critical process application, e.g., microelectronics manufacturing or other critical process applications. An HDA may also operate under vacuum conditions. An HDA may have a variety of different configurations comprising at least one membrane and at least one vessel containing a non-aqueous hydrazine solution and a head space separated from the solution by membrane.

Figure 1B:
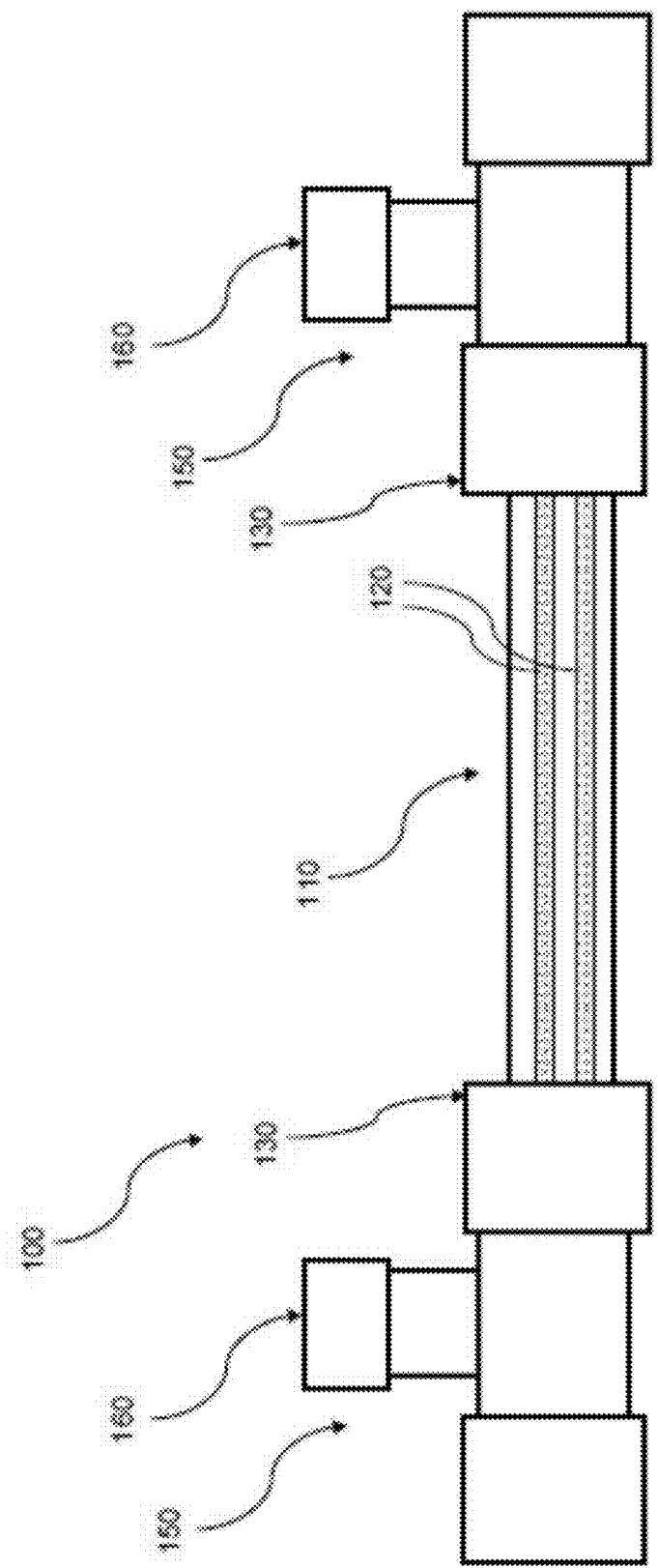
FIG. 1B is a diagram illustrating an embodiment of a hydrazine delivery assembly (HDA) according to certain embodiments of the present invention.

FIGS. 1A and 1B depict different views of one embodiment of an HDA 100 and a membrane assembly 110 that forms part of an HDA that can be used as provided herein. FIG. 1A shows membrane assembly 110 comprising a plurality of membranes 120, for example, 5R NAFION® membrane, which can be configured as lumens. As depicted in FIG. 1A, membranes 120 configured into lumens are inserted into a collector plate 130 through a plurality of holes within collector plate 130. Membrane assembly 110 also comprises a plurality of polytetrafluoroethylenene (PTFE) rods 140 inserted into collector plate 130. As shown in FIG. 1B, as part of HDA 100, membrane assembly 110 comprises membrane lumens 120 spanning collector plates 130. HDA 100 further comprises endcaps 150 at each end of membrane assembly 110. Endcaps 150 further include branches 160, which can be fitted with tubing to provide access to the interior of HDA 100, e.g., to fill, empty, clean, or refill the HDA.

Figure 2A:
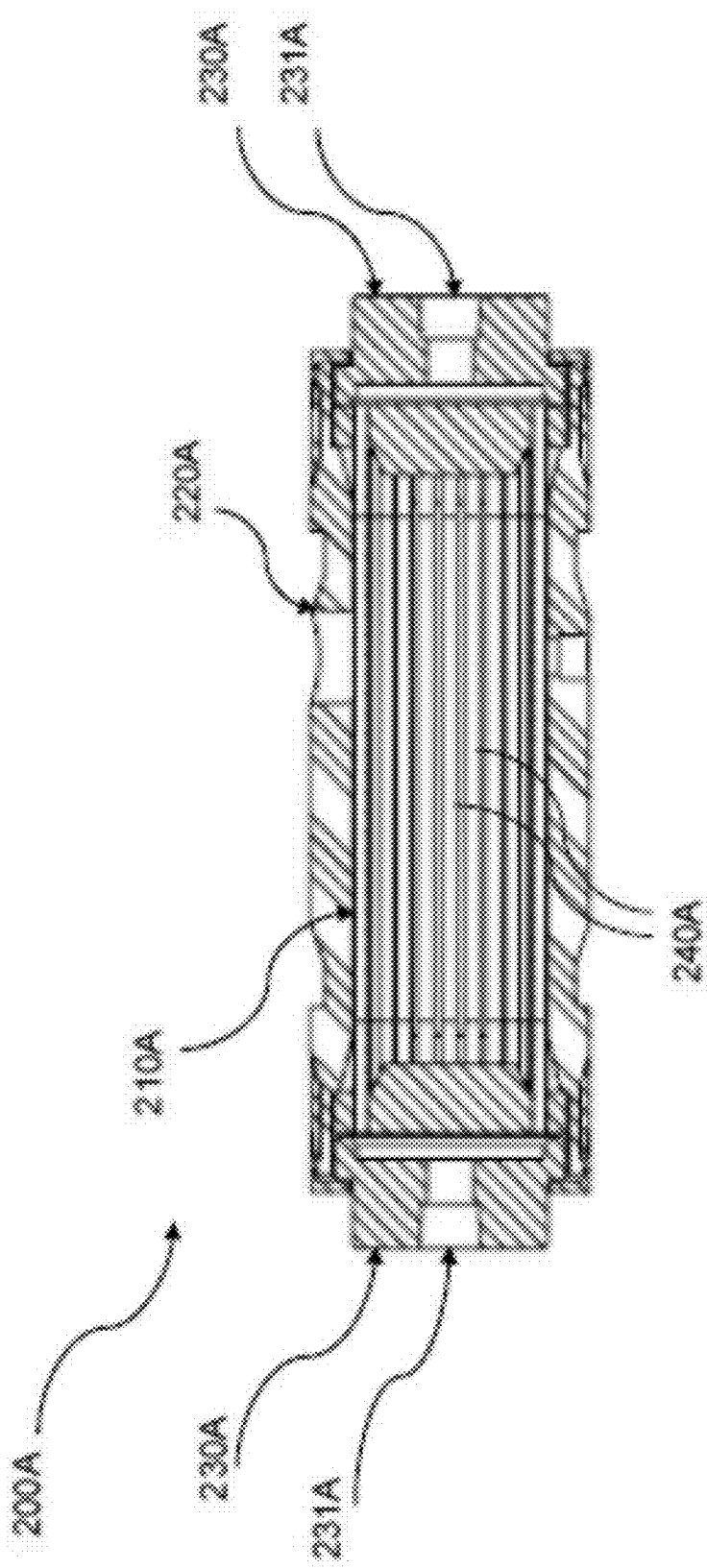
FIG. 2A is a cross-sectional view of an embodiment of an HDA according to certain embodiments of the present invention.
Figure 2B:
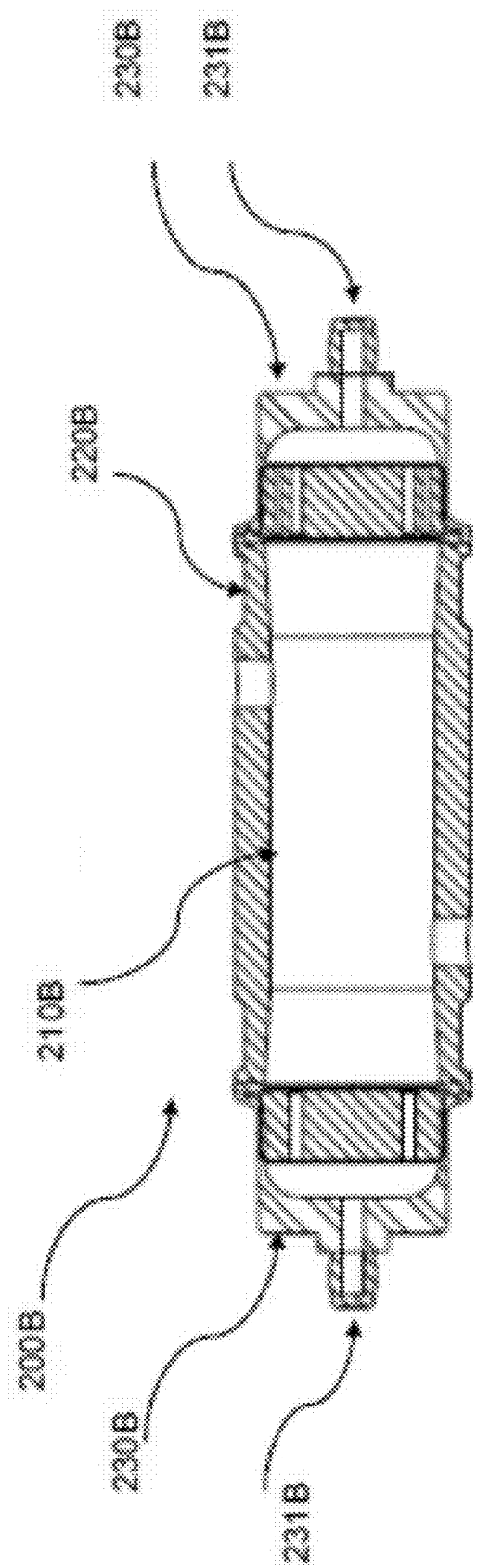
FIG. 2B is a cross-sectional view of an embodiment of an HDA according to certain embodiments of the present invention.

FIG. 2A and FIG. 2B show a cross-sectional view of two embodiments of HDAs according to certain embodiments of the present invention.

HDA 200A, as shown in FIG. 2A, comprises a membrane assembly 210A within a shell housing 220A and end caps 230A configured to couple to shell housing 220A. Membrane assembly 210A comprises of a plurality of membranes 240A, which can be configured as lumens. The number of lumens can vary depending on various factors, including the size of the lumens, the size of HDA 200A, and the operating conditions of the HDA. In certain embodiments, an HDA may contain up to 1000 membrane lumens, up to 500 lumens, up to 200 lumens, up to 100 lumens, or up to 50 lumens. For example, HDA 200A may have about 20-50 membrane lumens. The membrane lumens can be constructed from a perfluorinated sulfonic acid membrane, for example, 5R NAFION® membrane. The end caps 230A and shell housing 220A can be formed from a variety of materials, for example, PTFE, stainless steel (such as 316 stainless steel), or other suitable materials. Each end cap 230A further comprises a gas connection 231A. Gas connection 231A can take the form of a variety of connection configurations and sizes, for example, ¼" VCR, ¼" NPT, or other suitable connectors.

HDA 200B, as shown in FIG. 2B, comprises a membrane assembly 210B within a shell housing 220B and end caps 230B configured to couple to shell housing 220B. Membrane assembly 210B can be comprised of a plurality of membrane lumens (not shown). The number of lumens can vary depending on various factors, including the size of the lumens, the size of HDA 200B, and the operating conditions of the HDA. In certain embodiments, an HDA may contain up to 1000 membrane lumens, up to 500 lumens, up to 200 lumens, up to 100 lumens, or up to 50 lumens. For example, HDA 200B may have about 20-50 membrane lumens. The membrane lumens can be constructed from a perfluorinated sulfonic acid membrane, for example, 5R NAFION® membrane. The end caps 230B and shell housing 220B can be formed from a variety of materials, for example, PTFE, stainless steel (such as 316 stainless steel), or other suitable materials. Each end cap 230B can comprise a gas connection 231B. Gas connection 231B can take the form of a variety of connection configurations and sizes, for example, ¼" VCR, ¼" NPT, or other suitable connectors.

According to the various embodiments, the HDA can be filled with a non-aqueous hydrazine containing solution, while maintaining a head separated from the hydrazine containing solution by a membrane. Because the membrane is permeable to hydrazine and substantially impermeable to the other components of the solution, the head space will contain substantially pure hydrazine vapor in a carrier gas or vacuum, depending upon the operating conditions of the process.

According to various embodiments, an HDA can be constructed similarly to the devices described in commonly assigned U.S. Pat. No. 7,618,027, which is herein incorporated by reference.

Figure 12:
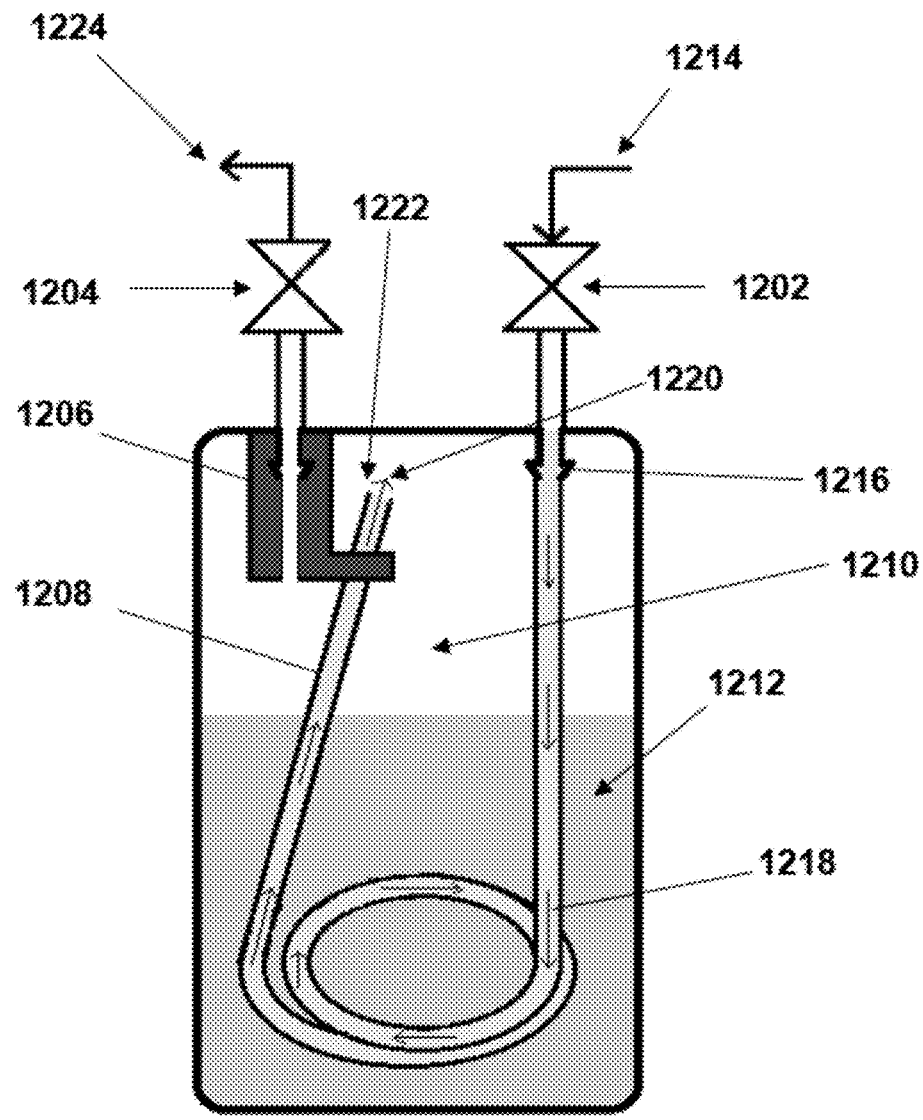
FIG. 12 is a diagram illustrating an HDA according to certain embodiments of the present invention.

According to certain embodiments, a device for containing liquid and a vapor phase comprising a volatile chemical or composition, which may be a non-aqueous hydrazine containing solution, is provided, wherein the membrane contacts the volatile chemical or composition on one side of the membrane and a carrier gas stream on the other side of the membrane. FIG. 12 depicts one example of such a device 1200, comprising (a) a chamber containing a liquid comprising a volatile chemical or chemical composition, (b) a head space comprising a vapor phase that includes the volatile chemical or chemical composition in the gas phase, (c) a inlet port through which a carrier gas stream can enter the chamber, and (d) a protected outlet port through which a process gas stream comprising carrier gas and the volatile chemical or chemical composition can exit the head space.

As shown in FIG. 12, carrier gas 1214 enters through the inlet port 1202. Carrier gas 1214 then moves through the membrane 1208 which is attached to inlet port 1202 by seal 1216. In certain embodiments, seal 1216 provides a leak tight connection between inlet port 1202 and 1208. In certain embodiments, seal 1216 may not be leak tight or may be a partial seal to allow a portion of carrier gas 1214 to flow into head space 1210. In certain embodiments, membrane 1208 is a tubular membrane, but the geometry of the may be adapted according to the requirements of the particular application or process in which the device is used. One side of membrane 1208 is configured to contact liquid 1212, which comprises a volatile chemical or composition capable of diffusing across membrane 1208. Carrier gas 1214 flows through membrane 1208 on a side opposite the side that is in contact with liquid 1212. Process gas stream 1218, comprising the volatile chemical or composition in the gas phase, is formed as the volatile chemical or composition diffuses across the membrane into the carrier gas stream. Membrane 1208 allows certain components of liquid 1212 to diffuse across the membrane into the carrier gas stream to provide a select process gas stream 1218, while preventing other components of liquid 1212 from diffusing into the process gas stream 1218 (e.g., water, metal ions, other ionic contaminants, and other contaminants). At the outlet 1222 of membrane 1208, process gas stream 1218, comprising carrier gas 1214 and a process chemical from liquid 1212, enters headspace 1210. Thus, the pressure inside of tubular membrane 1208 matches the pressure in head space 1210 and, thus, the vapor pressure of liquid 1212, which prevents the collapse of the membrane when the outlet pressure is lower than the inlet pressure. Process gas 1220 contained in headspace 1210 exits the device through the splash guard 1206 and outlet port 1204 for delivery to a critical process 1224. In this embodiment, splash guard 1206 retains the open end 1222 of the tubular membrane 1208 such that the process gas stream exiting passing through outlet port 1204 is substantially free of liquid contaminants, e.g., droplets, particles, mists, or fogs.

In many embodiments, e.g., the embodiment shown in FIG. 12, the membrane is partially immersed in the liquid source. Submerging the membrane increases the mass transfer surface area and the residence time the carrier gas has to fully saturate with gas generated from the liquid source. The membrane may be long enough to reach the bottom of the canister and then back up to the surface above the liquid. The membrane can range from about 3.0 inches in length or less to about 72 inches in length or more, including lengths in between such as about 5, 10, 15, 20, 25, 30, or 35 inches to about 40, 45, 50, 55, 60, or 65 inches or more. The immersed part of the membrane can be coiled to increase liquid to membrane surface area. Multiple membranes can be used and run in parallel to further increase liquid to membrane surface area. The membrane may be about 0.002 inches thick or less to about 0.010 inches thick or more, including about 0.003, 0.004, or 0.005 inches thick to about 0.006, 0.007, 0.008, or 0.009 inches thick or more. The diameter of the membrane may be about 0.062 inches or less to about 0.250 inches or more, including 0.070, 0.080, 0.090, 0.100, 0.110, 0.120, 0.130, 0.140, or 0.150 inches to about 0.160, 0.170, 0.180, 0.190, 0.200, 0.210, 0.220, 0.230, or 0.240 inches or more.

In many embodiments, e.g., the embodiment shown in FIG. 12, the device includes a splash guard. The splash guard limits the volume, velocity, or nature of the liquid exiting through the outlet of the device. The splash guard is capable of maintaining the outlet of the tubular membrane above the liquid. In several embodiments, the splash guard has a long narrow slit in the conductive path to the outlet barb which prevents droplets from entering the gas stream leaving the outlet port. The splash guard is made of a material compatible with the chemistries being used in the liquid source and carrier gas. For example, low-reactive materials such as, but not limited to, stainless steel, aluminum, or plastic may be used. The splash guard may be attached to the container by fitting onto the outlet barb. In some embodiments, the splash guard is about 1.50 inches in height, the slit is about 0.03 inches in width and about 1.25 inches in height, and the slit's length is the same as the diameter of the splash guard which is about 1.00 inch.

Although a primary purpose of the present disclosure is gas phase delivery of non-aqueous hydrazine according the methods, systems, and devices provided herein, other process chemicals capable of diffusing across the membrane may be used in the liquid source and, therefore, may also be part of process gas stream 1218 exiting the outlet port, include hydrogen peroxide, water, alcohols (such as ethanol, methanol, ethylene glycol, pentanol, glycerol, xylitol, or isopropyl alcohol), amines (such as hydrazine, methylamine, ethanolamine, dimethylamine, aniline, trimethylamine, triphenylamine, aziridine, or methylethanolamine), or ammonium hydroxide. These process chemicals, whether in the liquid source or in the process gas, may be used alone or in combination. In certain embodiments, the liquid source may include a polar solvent, whereas in certain other embodiments the liquid source may include a nonpolar solvent.

The devices disclosed herein that are capable of containing a liquid source comprising at least one process chemical and delivering at least one process chemical in the gas phase to a critical process application, e.g., the device shown in FIG. 12, may be used in conjunction with the methods, systems, and other devices of the present invention, or they may be used as standalone devices for delivering a process gas stream to a critical process application.

An embodiment according to an aspect of the methods, systems, and devices provided herein is described below by reference to a manifold 300, as shown by reference to FIG. 3. According to the embodiment shown by reference to FIG. 3, a carrier gas 310 flows through the head space of HDA 320, which can be an HDA as described above. A mass flow controller (MFC) 330, for example, Unit UFC-1260A 1 slm, can be used to control the flow rate of carrier gas 310, which can be set to 1 slm, for example. Analysis of the amount of hydrazine in the gas stream may require dilution of the resultant gas stream, which can be accomplished with dilution gas 350. A mass flow controller (MFC) 340, for example, a Unit UFC-1260A 10 slm can be used to control the flow rate of dilution gas 350. Carrier gas 310 and dilution gas 350 can be supplied by a gas source 360, which can be typically nitrogen or other suitable carrier gas. A valve 370 can be used to isolate the dilution line when it is not required. Check valves 371, 372 can be placed downstream of both MFC 330 and MFC 340 to protect them from possible hydrazine exposure. A 60 psig pressure gauge 373 can be placed between MFC 330 and check valve 372 to insure that the manifold's pressure does not exceed the maximum pressure allowed by hydrazine analyzer 380, e.g., 5 psig.

The nitrogen pressure can be maintained with a forward pressure regulator 374, typically set to 15 psig. A thermocouple 375 can measure the temperature of nitrogen carrier gas 310 before it enters HDA 320 for hydrazine addition. A thermocouple 376 can measure the temperature of the hydrazine solution in HDA 100. A thermocouple 377 can measure the gas temperature before entering hydrazine analyzer 380. Hydrazine analyzer 380 can pull in a sample of carrier gas 310 to measure the hydrazine concentration. Manifold 300 can further comprise a relative humidity/resistance temperature detector (RH/RTD) probe 378. A heater tape 390 can be placed on certain sections as indicated in FIG. 3. The manifold's temperature can be controlled in two separate zones, the membrane assemblies and the remaining tubing, with a Trilite Equipment & Technologies Controller and a Watlow 96 Controller, respectively. The entire manifold can be set up inside of a fume hood.

Figure 3:
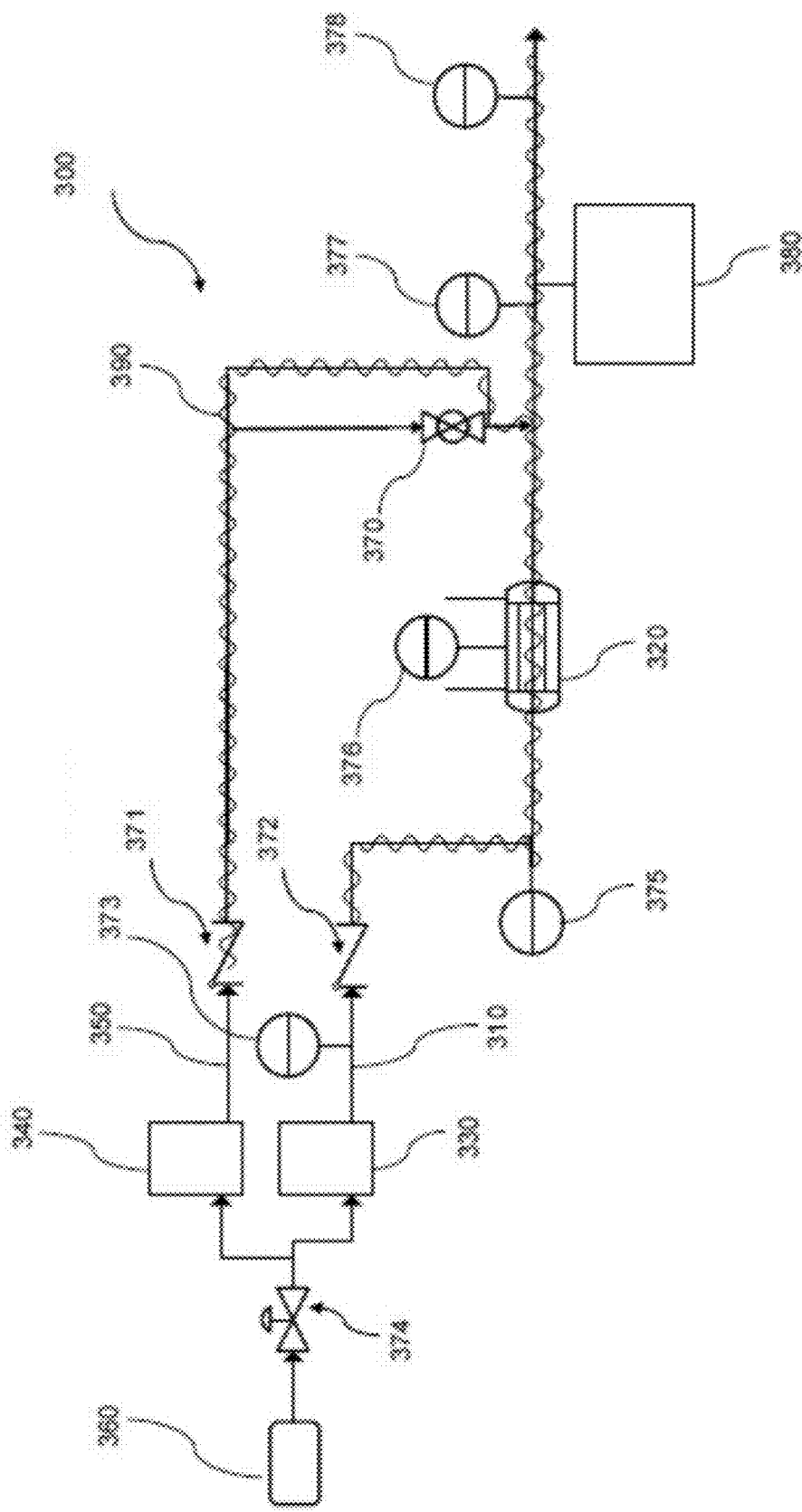
FIG. 3 is a P&ID of a manifold that can be used to test methods, systems, and devices for hydrazine delivery according to certain embodiments of the present invention.

The embodiment shown by reference to FIG. 3 is set up as a test apparatus to measure the amount of hydrazine introduced into a carrier gas stream under various operating conditions of an HDA. It will be understood that a similar apparatus can be used to deliver hydrazine to a critical process application.

Figure 4:
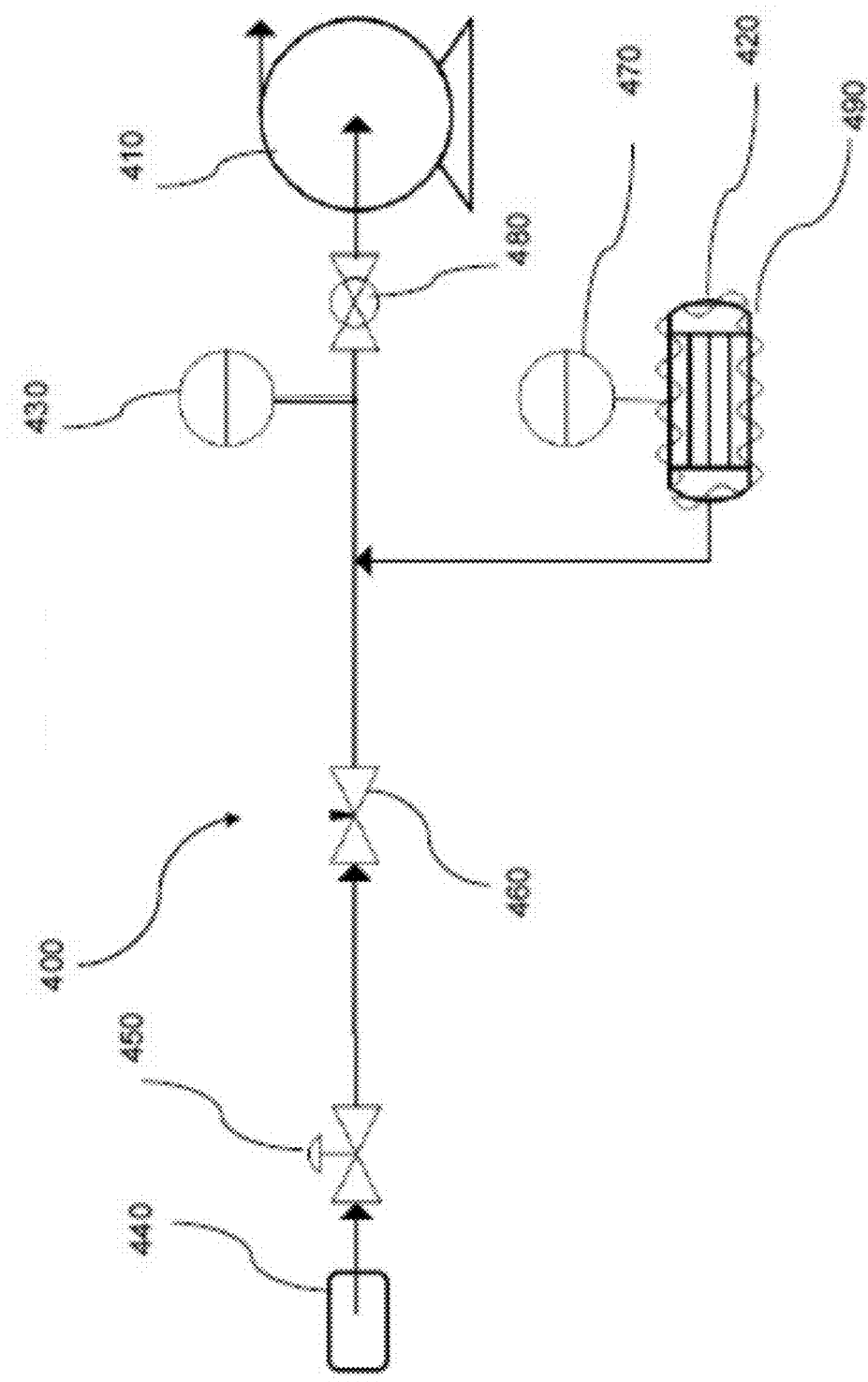
FIG. 4 is a P&ID of a manifold that can be used to test methods, systems, and devices for hydrazine delivery according to certain embodiments of the present invention.

FIG. 4 is a P&ID of a test manifold 400, according to another embodiment, used to demonstrate delivery of hydrazine under vacuum conditions, according to the methods, systems, and devices provided herein. According to the embodiment shown by reference to FIG. 4, a vacuum pump 410 removes gas from the hydrazine containing vapor side (i.e., head space) of HDA 420, which can be an HDA as described above. For example, vacuum pump 410 can be maintained at about 24 mmHg using a valve 480 and a pressure gauge 430. A gas source 440 can be maintained at a pressure of about 2 psig with a forward pressure regulator 450. A valve 460 can be used as a flow restrictor. A thermocouple 470 can be placed inside the filling tube of a HDA 420 to measure the solution's temperature inside the shell of HDA 420. The test involves contacting the vapor side, i.e., head space, of HDA 420 to a vacuum produced by vacuum pump 410 while holding HDA 420 at a constant temperature. A heat tape 490 can be placed around HDA 420 to allow for constant temperature control of the hydrazine containing solution within HDA 420. This vacuum-based method, system, and device is particularly preferred in numerous micro-electronics and other critical process applications that are operated at relatively reduced pressures (i.e., under vacuum).

The embodiment shown by reference to FIG. 4 is set up as a test apparatus to measure the amount of hydrazine introduced into a carrier gas stream under various operating conditions of an HDA. It will be understood that a similar apparatus can be used to deliver hydrazine to a critical process application.

Figure 5:
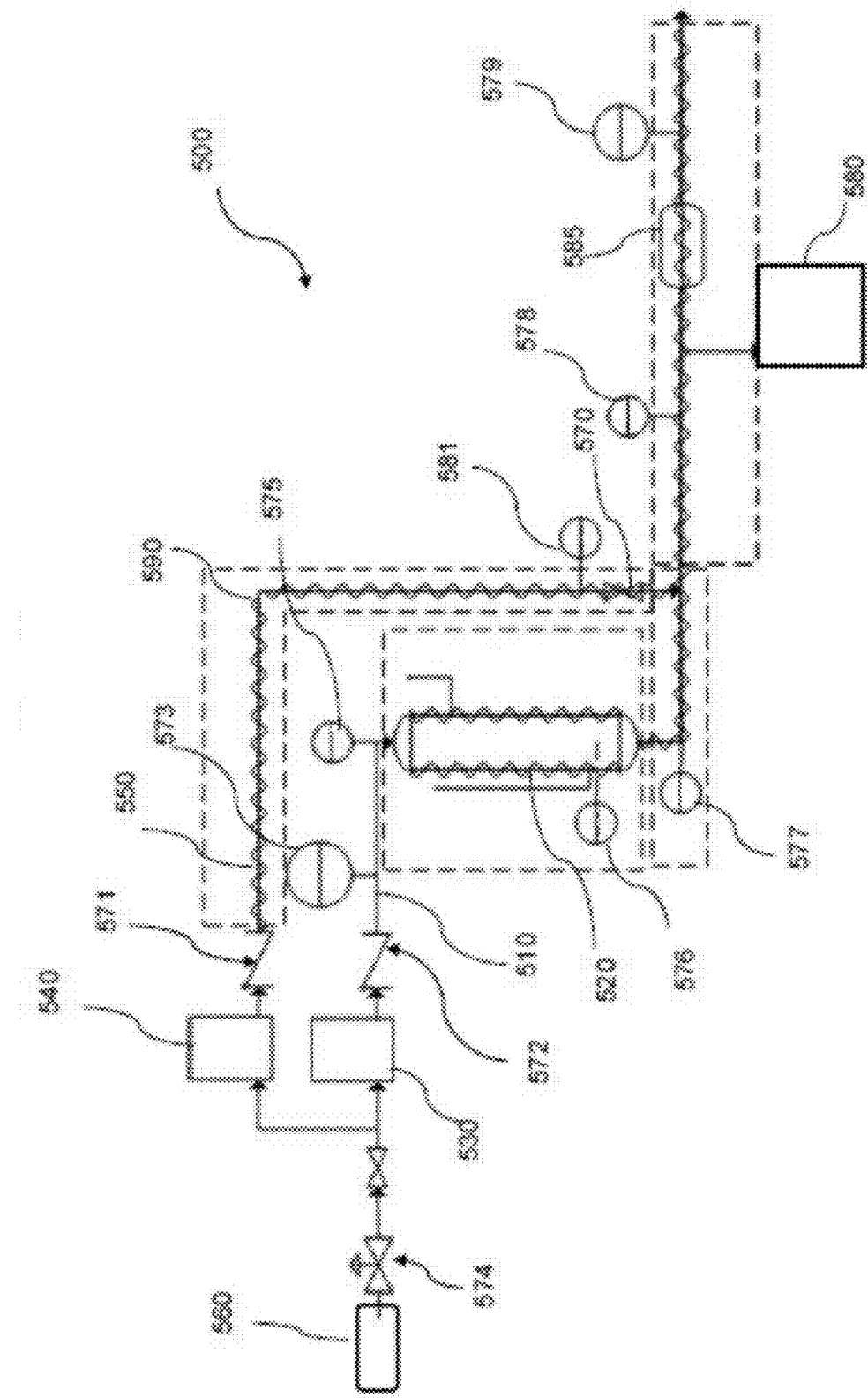
FIG. 5 is a P&ID of a manifold that can be used to test methods, systems, and devices for hydrazine delivery according to certain embodiments of the present invention.

FIG. 5 is a P&ID of a test manifold 500, according to another embodiment, used to demonstrate delivery of hydrazine, according to an aspect of the methods, systems, and devices provided herein. As shown in FIG. 5, a nitrogen carrier gas 510 can flow through the head space of HDA 520, which can be an HDA as described above. A mass flow controller (MFC) 530, for example, a Brooks SLA5850S1EAB1B2A1 5 slm, can be used to control the flow rate of nitrogen carrier gas 510, which can be set to 1 slm, for example. Analysis of the amount of hydrazine in the gas stream may require dilution of the resultant gas stream, which can be accomplished with dilution gas 550. A mass flow controller (MFC) 540, for example, a Brooks SLA5850S1EAB1B2A1 10 slm, can be used to control the flow rate of a nitrogen dilution gas 550. Nitrogen carrier gas 510 and nitrogen dilution gas 550 can be supplied by a nitrogen gas source 560. A valve 570 can be used to isolate the dilution line when desired. A pair of check valves 571, 572 can be placed downstream of both MFC 530 and MFC 540 to protect them from possible hydrazine exposure. A pressure gauge 573, for example, 100 psi gauge, can be placed between MFC 530 and HDA 520 to insure that the manifold's pressure does not exceed any maximum pressure allowed by an analyzer 580.

The nitrogen pressure can be maintained with a forward pressure regulator 574, for example set to 25 psig. A thermocouple 575 can measure the temperature of nitrogen carrier gas 510 before it enters HDA 520 for hydrazine addition. Within HDA 520, nitrogen carrier gas 510 can flow through the membrane tubes and hydrazine vapor can permeate through the membrane from the solution contained within the shell housing and combined with carrier gas 510. A thermocouple 576 can measure the temperature of the hydrazine solution in HDA 520. A thermocouple 577 can measure the gas temperature exiting HDA 520. In this embodiment, an analyzer 580 can be used to measure the hydrazine concentration in the gas stream. Analyzer 580 can be, for example, a MiniRAE 3000, which has a photoionization detector with an 11.7 eV gas discharge lamp. Analyzer 580 can, for example, pull a sample of the hydrazine containing gas stream to measure the hydrazine concentration. A thermocouple 578 can be used to measure the gas temperature before entering analyzer 580. A thermocouple 581 can be used to measure the temperature of nitrogen dilution gas 550.

Manifold 500 can further comprise a catalytic converter 585 configured to remove the hydrazine by converting it into nitrogen and hydrogen. Downstream of catalytic converter 585 can be a probe 579, for example, a E+E Elektronik EE371 humidity transmitter configured to measure the dew point (DP) and moisture concentration. Downstream of probe 579 can be a vent. A heater tape 590 can be placed on certain sections as indicated in FIG. 5. The manifold's temperature can be controlled in four separate zones, indicated by the dotted line boxes, with Watlow EZZone® 96 controllers, respectively. The entire manifold can be set up inside of a fume hood.

The embodiment shown by reference to FIG. 5 is set up as a test apparatus to measure the amount of hydrazine introduced into a carrier gas stream under various operating conditions of an HDA. It will be understood that a similar apparatus can be used to deliver hydrazine to a critical process application.

Figure 6:
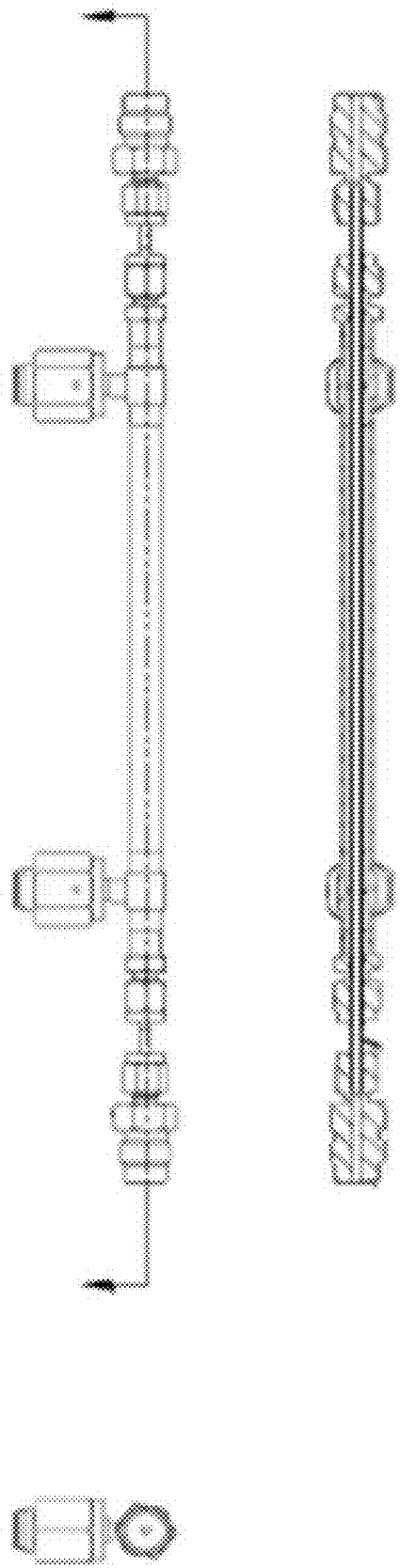
FIG. 6 is a diagram illustrating a membrane assembly and HDA according to certain embodiments of the present invention.

FIG. 6 is a diagram illustrating a side and cross-sectional view of a membrane assembly useful in certain embodiments of the present invention when a single membrane is used. The membrane assembly may be incorporated into, for example, an HDA such as one shown in FIG. 1B. As shown in FIG. 6, in one embodiment of the invention, the membrane may be a single membrane lumen sleeved over a stainless steel tube containing a calibrated number of holes to provide a specific membrane surface area available for permeation. The sleeved stainless steel tube is encased inside an outer tube to form the Hydrazine Delivery Assembly (HDA). Liquid hydrazine is filled inside the space between the inner and outer tubes. A carrier gas is directed to flow through the inner tube to carry hydrazine vapor which has permeated the membrane to the desired process.

Figure 7:
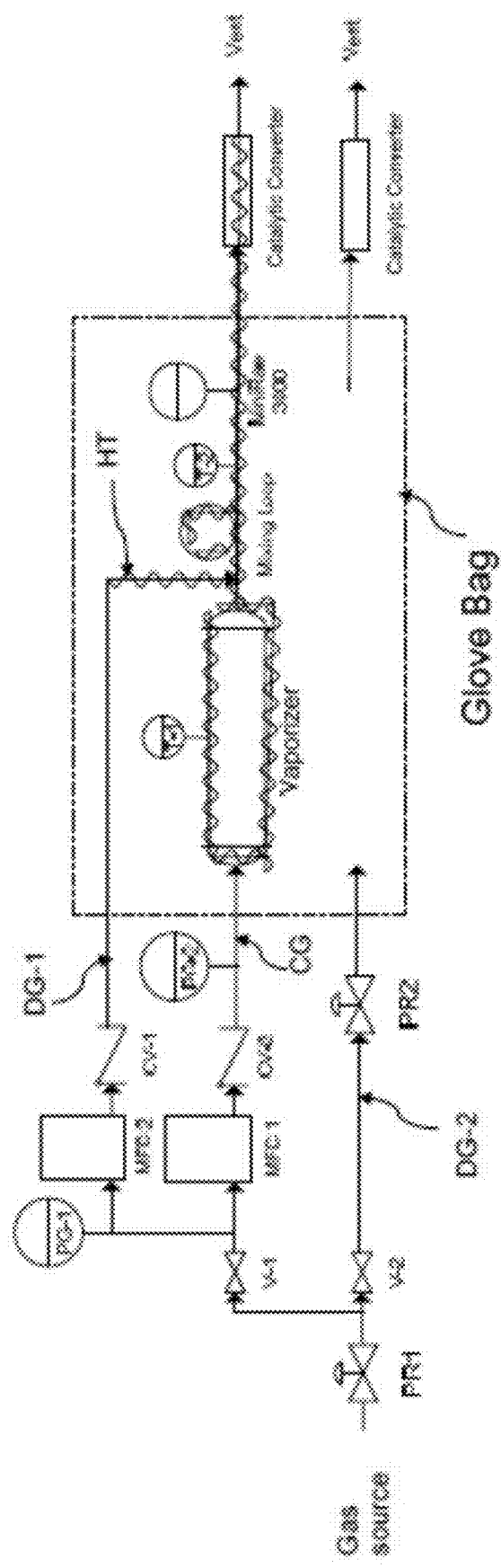
FIG. 7 is a P&ID of a manifold that can be used to test methods, systems, and devices for hydrazine delivery according to certain embodiments of the present invention.

FIG. 7 is a P&ID of a manifold that can be used to test methods, systems, and devices for hydrazine delivery according to certain embodiments of the present invention. According to this embodiment, a carrier gas (CG) flows through the head space of the HDA, labeled "Vaporizer," which can be an HDA as described above. A mass flow controller (MFC 1), for example, a 5 slm Brooks SLA5850S1EAB1B2A1 mass flow controller, can be used to control the flow rate of carrier gas into the HDA. Analysis of the amount of hydrazine in the gas stream exiting the vaporizer may involve first diluting the resultant gas stream, which can be accomplished with a dilution gas (DG-1). A mass flow controller (MFC 2), for example, a 10 slm Brooks SLA5850S1EAB1B2A1 mass flow controller, can be used to control the flow rate of dilution gas DG-1. A separate line of dilution gas DG-2 may be supplied to a portion of the manifold positioned within a Glove Bag.

Carrier gas CG and dilution gases DG-1 and DG-2 can be supplied by a Gas Source, which can be typically nitrogen or other suitable carrier gas. In some embodiments such as the one shown in FIG. 7, the carrier gas and dilution gases share the same gas source. In other embodiments, the carrier gas and dilution gases may have independent gas sources. Valves V-1 and V-2 can be used to control gas flow into the HDA/DG-1 dilution line or into the DG-2 dilution line/Glove Bag, respectively. Check valves CV-1 and CV-2 can be placed downstream of MFC 2 and MFC 1, respectively, to protect them from possible hydrazine exposure. A pressure gauge PG-2 can be placed between CV-2 and the Vaporizer to measure pressure upstream of the Vaporizer.

The carrier gas pressure can be maintained with a forward pressure regulator PR1 and measured with pressure gauge PG-1. A forward pressure regulator PR2 can be used to control the flow of dilution gas DG-2 through the Gas Bag. A thermocouple T-1 can measure the temperature of the hydrazine solution in the Vaporizer. A thermocouple T-2 can measure the gas temperature after a mixing loop and before entering a hydrazine analyzer. The MiniRAE 3000 is one example of a hydrazine analyzer. Heater tape HT can be placed on certain sections, such as on the Vaporizer, a portion of the dilution gas DG-1 line, and lines downstream of the Vaporizer as indicated in FIG. 7. The manifold may also comprise catalytic converters downstream of the Vaporizer and Glove Bag to decompose hydrazine to nitrogen and hydrogen. The entire manifold can be set up inside of a fume hood.

The embodiment shown by reference to FIG. 7 is set up as a test apparatus to measure the amount of hydrazine introduced into a carrier gas stream under various operating conditions of an HDA. It will be understood that a similar apparatus can be used to deliver hydrazine to a critical process application.

EXAMPLE 1

Experimental

In the examples of the disclosure, membranes were prepared by purchasing sulfonyl fluoride perfluorinated polymers, extruding them, and then hydrolyzing them by methods known in the art to form membranes. Such membranes are also referred to as NAFION® herein.

The manifold illustrated in FIG. 7 was utilized for a test procedure in this Example. The test procedure involved obtaining stable gas phase hydrazine readings utilizing a non-aqueous, substantially pure hydrazine solvent as a liquid source.

A NAFION® vaporizer (P/N#200801-01) was used for this experiment. This vaporizer included a single 5R NAFION® membrane sleeved over a ⅛" SS (stainless steel) tubing. The SS tubing had twenty 0.06" diameter holes, allowing for a total permeable area of 0.06 in$^2$. The tubing was enclosed by a ⅜" SS tubing with two ¼" fill ports for the shell side. The volume of the shell side was approximately 8 ml.

The manifold was setup in a fume hood. The nitrogen pressure was maintained at 25 psig with a forward pressure regulator (PR-1) and measured with a pressure gauge (PG-1). Two valves (V-1 and V-2) were used to terminate gas flow through vaporizer and/or dilution line. A 5 slm Brooks SLA5850S1EAB1B2A1 Mass Flow Controller (MFC-1) was used to control the carrier gas flow rate. A 10 slm Brooks SLA5850S1EAB1B2A1 Mass Flow Controller (MFC-2) was used to control the dilution gas flow rate. Check valves (CV-1 and CV-2) were placed downstream of both MFCs to protect them from being exposed to hydrazine. A forward pressure regulator with gauge (PR-2) was used to control flow of nitrogen through gas bag. The pressure upstream of the vaporizer was measured with a pressure gauge (PG-2). A J-type thermocouple (TC-1) was attached to the vaporizer as a control point for the heater tape. The carrier gas was mixed with the nitrogen from the dilution line downstream of the vaporizer. A J-type thermocouple (TC-2) was used to monitor gas temperature after mixing. A MiniRAE 3000, which has a photoionization detector (PID) with an 11.7 eV gas discharge lamp, was used to measure the hydrazine concentration in the gas stream. The test manifold and glove bag vent lines had catalytic converters that decomposed the hydrazine to nitrogen and hydrogen. The vaporizer, a portion of the dilution line, and the test manifold downstream of the vaporizer was heat-traced with heater tape.

For this experiment, the carrier gas flow was set to 1 slm. The dilution gas flow was initially set to 1 slm and would be increased if the concentration was above 2000 ppm (upper detection limit of the MiniRae 3000). The manifold was heated to keep the gas temperature at 30° C. at TC-2.

Figure 8:
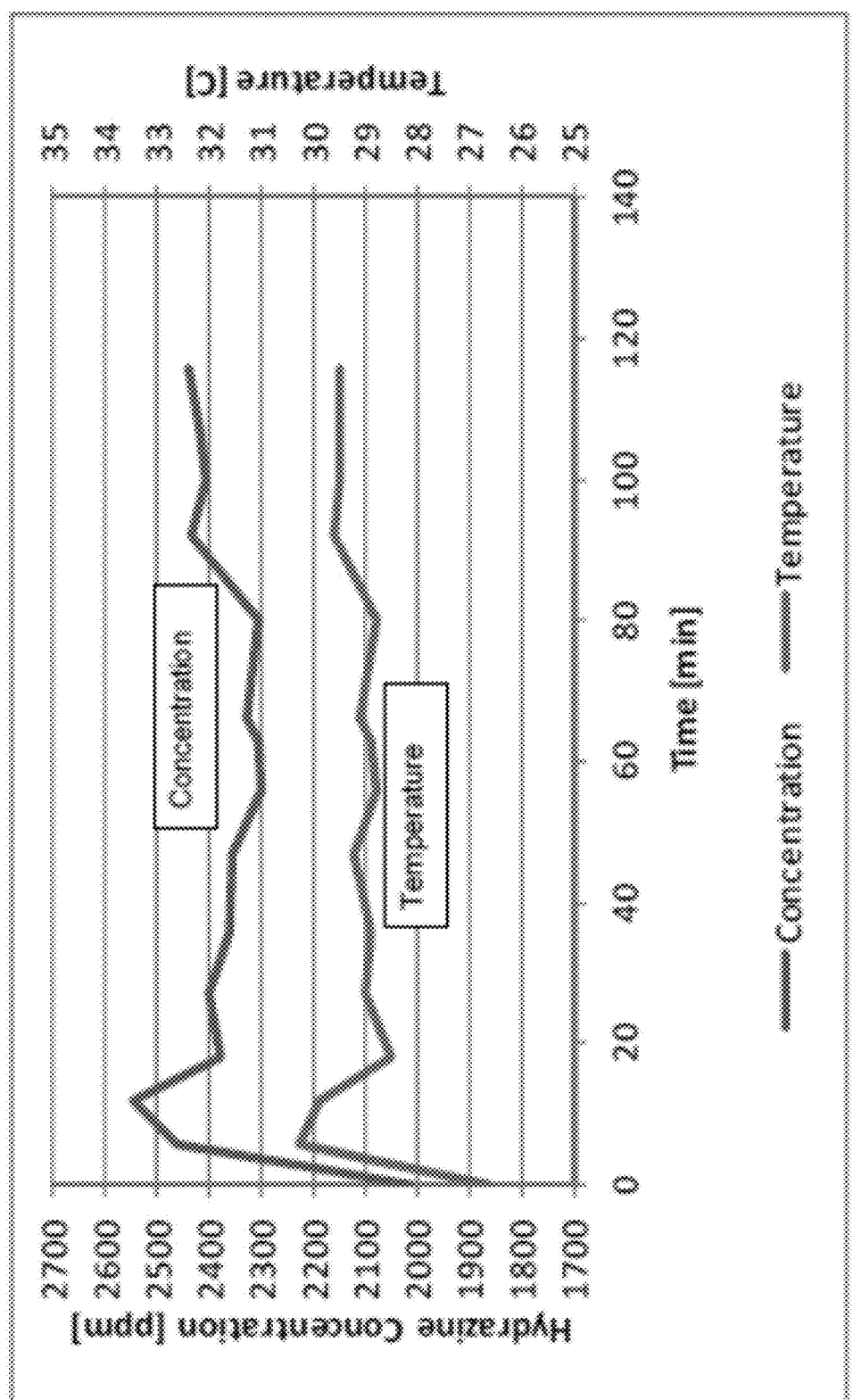
FIG. 8 is a chart depicting hydrazine gas concentration and temperature over time according to an embodiment of the present invention, using substantially pure hydrazine as a liquid source.

FIG. 8 represents the results from this experiment with the carrier gas flow and dilution gas flow at 1 slm. As shown, the hydrazine output was directly affected by the gas temperature once the system was stabilized. This effect was demonstrated when the temperature setpoint for this experiment was raised from 30° C. to 31° C. 78 minutes into the test. The average concentration of hydrazine was 2426 ppm for the last 26 minutes of the test. The result is a permeation rate of 0.04043 L/min/in$^2$ under these conditions.

EXAMPLE 2

Figure 9:
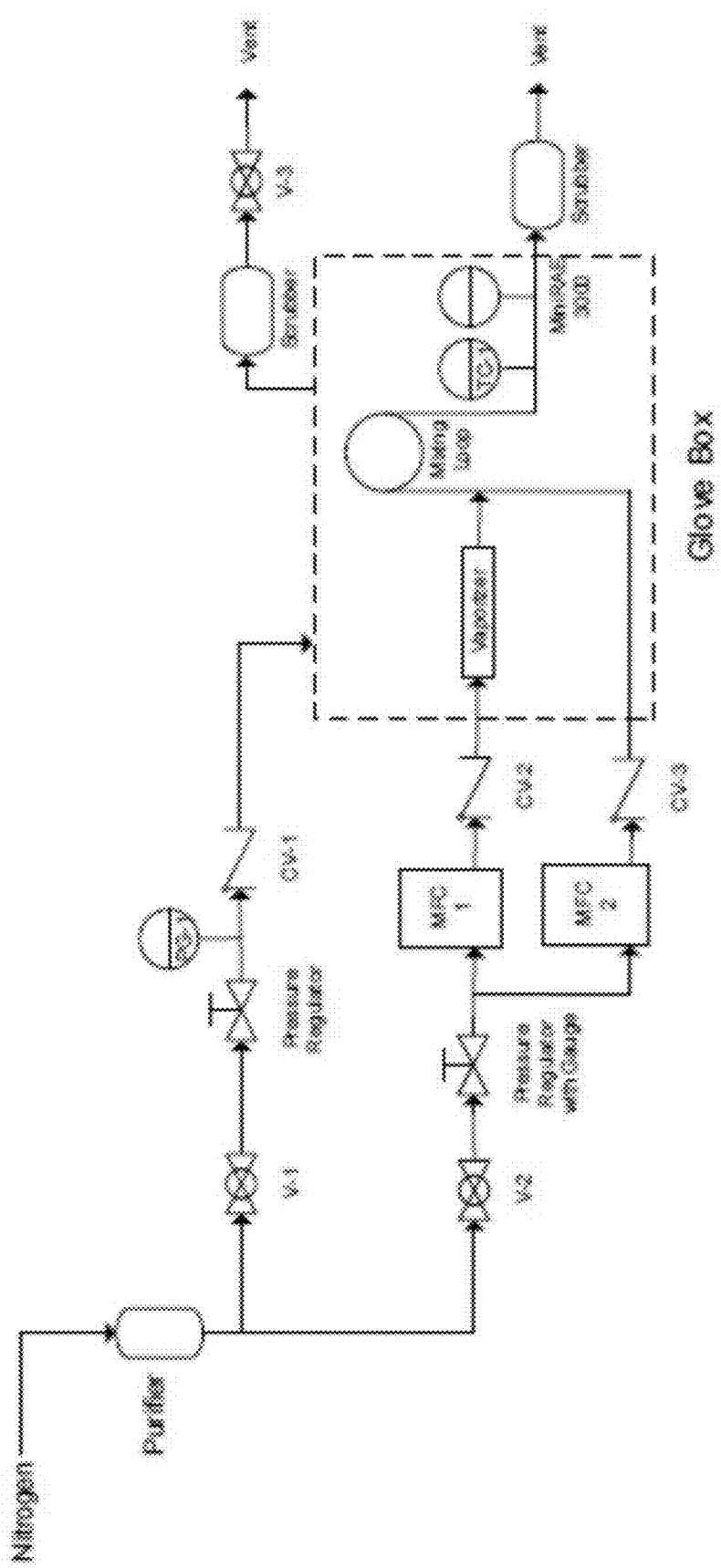
FIG. 9 is a P&ID of a manifold that can be used to test methods, systems, and devices for hydrazine delivery according to certain embodiments of the present invention.

The manifold illustrated in FIG. 9 was utilized for test procedures in this Example. The test procedures involved obtaining stable gas phase hydrazine readings using either an anhydrous 98% hydrazine solvent as a liquid source, or a solution of 65% hydrazine in poly(ethylene glycol) dimethyl ether solvent (Mn=250) as a liquid source.

A NAFION® vaporizer (P/N#200846-A) was used for these experiments. This vaporizer consisted of a single 5R NAFION® membrane sleeved over a ⅛" SS tubing. The SS tubing had ten 0.06" diameter holes, allowing for a total permeable area of 0.03 in$^2$. The tubing is enclosed by a ⅜" SS tubing with two ¼" fill ports for the shell side. The volume of the shell side was approximately 8 ml.

The manifold was setup in a fume hood. An Entegris 500KF Gatekeeper purifier was used to remove oxygen, water, and hydrocarbons from the gas stream. Two valves (V-1 and V-2) were used to terminate gas flow through glove box and the test manifold respectively. The nitrogen flow inside the glove box was maintained with a forward pressure regulator and the pressure measured with a pressure gauge (PG-1). A check valve (CV-1) was placed upstream of the glove box to prevent back streaming of the hydrazine. A forward pressure regulator with gauge was used to maintain a gas pressure of 25 psig upstream of the MFCs. A 5 slm Brooks SLA5850S1EAB1B2A1 Mass Flow Controller (MFC-1) was used to control the carrier gas flow rate. A 10 slm Unit Mass Flow Controller (MFC-2) was used to control the dilution gas flow rate. Check valves (CV-2 and CV-3) were placed downstream of both MFCs to protect them from being exposed to hydrazine.

A single-lumen vaporizer was used to add hydrazine vapor to the gas stream. The mixing loop was used to mix nitrogen from the dilution line and hydrazine vapor in the carrier gas downstream of the vaporizer. A J-type thermocouple (TC-1) was used to monitor gas temperature after mixing. A MiniRAE 3000, which has a photoionization detector (PID) with an 11.7 eV gas discharge lamp, was used to measure the hydrazine concentration in the gas stream. The test manifold and glove box vent lines had scrubbers that catalytically decompose the hydrazine to nitrogen and hydrogen. A valve (V-3) was used to create backpressure in the glove box and for isolation.

For this Example, two solutions were tested at room temperature. One solution was anhydrous 98% hydrazine (Sigma Aldrich). The second solution was 65% w/w hydrazine (p=1.029 g/ml) in poly(ethylene glycol) dimethyl ether (p=1.03 g/ml). An 8 ml solution was made with 5.2 ml of anhydrous 98% hydrazine and 2.8 ml of poly(ethylene glycol) dimethyl ether.

Before each test run, the MiniRAE 3000 was calibrated with 100 ppm isobutene gas standard. Once the analyzer was attached the test manifold, the solution was added to the vaporizer without gas flowing through the test manifold. Once filled, the carrier gas flow was set to 1 slm and the dilution gas flow was to 1 slm. The dilution gas flow would be increased if the concentration was above 2000 ppm (upper detection limit of the MiniRAE 3000). Readings of the gas temperature and hydrazine concentration were recorded. Stabilization would be determined as when the vaporizer output change was less than 5 ppm/min.

Figure 10:
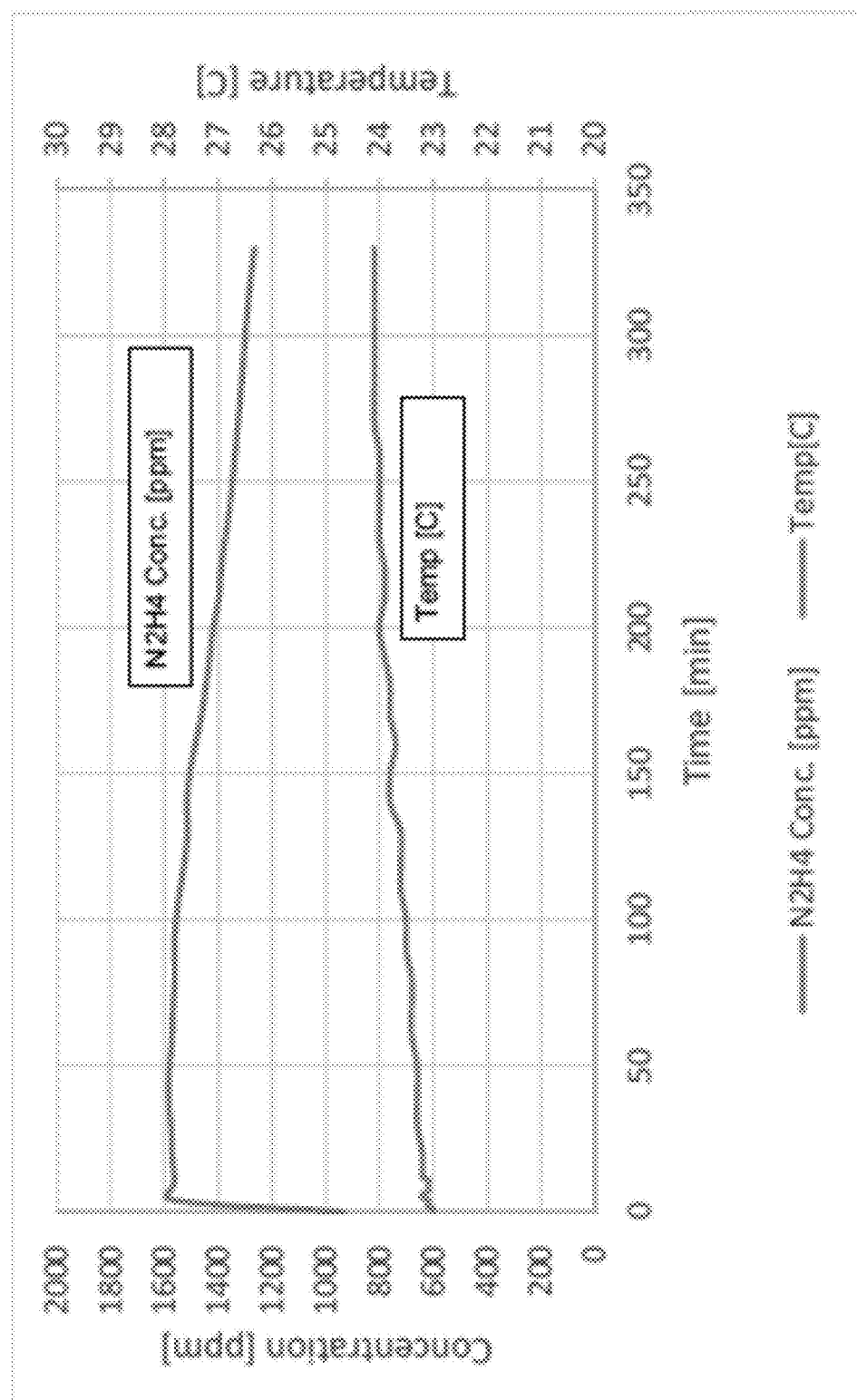
FIG. 10 is a chart depicting hydrazine gas concentration and temperature over time according to an embodiment of the present invention, using anhydrous 98% hydrazine as a liquid source.

FIG. 10 represents the results from the anhydrous 98% hydrazine with the carrier gas flow and dilution gas flow at 1 slm for 330 minutes. After stabilization was reached in ten minutes, the average concentration was 1482.7 ppm±102.2 ppm at an average temperature of 23.6° C.±0.4° C. Thus, the concentration was stable to within less than 10% of the average concentration. The result is an average permeation rate of 0.04942 L/min/in$^2$ under these conditions. This hydrazine permeation rate was close to the 0.04043 L/min/in$^2$ permeation rate measured during the previous test done in Example 1.

Figure 11:
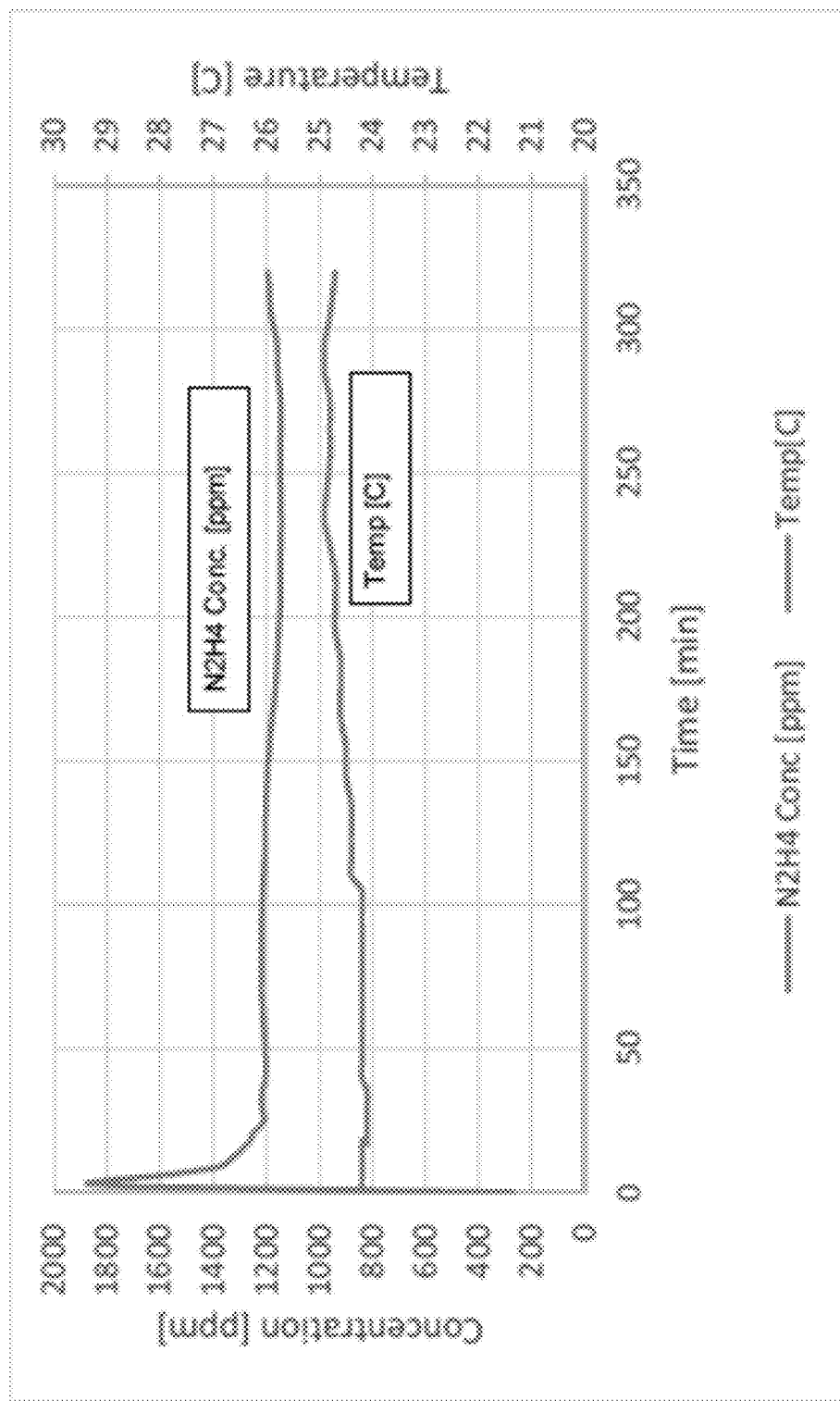
FIG. 11 is a chart depicting hydrazine gas concentration and temperature over time according to an embodiment of the present invention, using 65% hydrazine in poly(ethylene glycol) dimethyl ether as a liquid source.

FIG. 11 represents the results from the 65% hydrazine in poly(ethylene glycol) dimethyl ether with the carrier gas flow and dilution gas flow at 1 slm for 320 minutes. After stabilization was reached in 30 minutes, the average concentration was 1190.6 ppm±27.6 ppm with an average temperature of 24.5° C.±0.3° C. The result was an average permeation rate of 0.03969 L/min/in$^2$ under these conditions. Spikes in hydrazine concentration shown near time zero in FIGS. 10 and 11 reflect artifacts in the measuring instruments and are not deemed to be accurate or relevant.

The permeation was 19.7% less with the 65% hydrazine/poly(ethylene glycol) dimethyl ether solution in comparison to the 98% hydrazine solution. An encouraging attribute shown with the 65% hydrazine/solvent was that the output was more stable over time than the 98% hydrazine hydrate solution. In 290 minutes the 98% hydrazine solution concentration output decreased 263 ppm. However, the 65% hydrazine/poly(ethylene glycol) dimethyl ether solution concentration output only decreased 23 ppm in 290 minutes. The overall result with the poly(ethylene glycol) dimethyl ether presents it as a viable solvent for safe hydrazine vapor delivery.

By controlling the temperature of the hydrazine containing solution and, as applicable, the carrier gas or vacuum, particular hydrazine concentrations can be delivered The stability of the hydrazine concentration in the process gas stream can be controlled to less than about 20%, e.g., less than about 18%, less than about 16%, less than about 14%, or less than about 12%, or less than about 10%. In a preferred embodiment, the stability of the hydrazine concentration in the process gas stream can be controlled to less than about 10% of the average concentration within one standard deviation, e.g., less than about 9%, less than about 8%, less than about 7%, less than about 6%, less than about 5%, less than about 4%, less than about 3%, less than about 2%, or even less than about 1%. The average concentration does not include measurements by the instrument prior to achieving equilibrium. For example, the measurement in FIG. 11 of hydrazine concentration includes what appears to be a spike of up to about 1900 ppm. This spike is an instrument factor and not an actual measurement as it takes on the order of about 10 minutes or more for the instrument to stabilize and all average concentration readings hereunder take such stabilization into account. The selection of a particular hydrazine concentration will depend on the requirements of the application or process in which the hydrazine containing process gas will be used. In certain embodiments, the hydrazine containing gas stream may be diluted by adding additional carrier gas. In certain embodiments, the hydrazine containing gas stream may be combined with other process gas streams prior to or at the time of delivering hydrazine to an application or process. Alternatively or additionally, any residual solvent or stabilizers, or contaminants present in the hydrazine containing process gas may be removed in a purification (e.g., dehumidification) step using a purifier apparatus.

EXAMPLE 3

Figure 13:
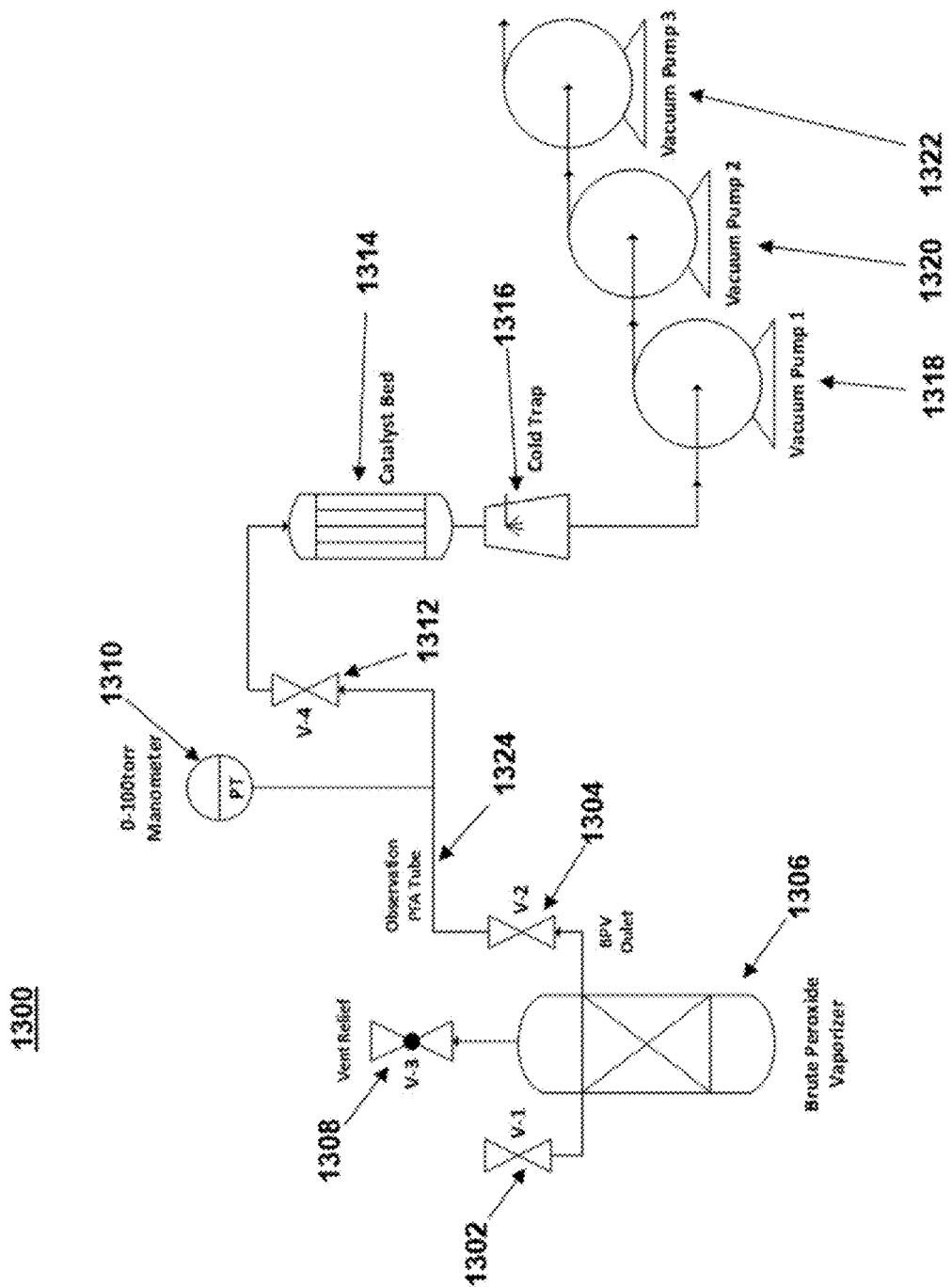
FIG. 13 is a P&ID of a manifold that can be used to test methods, systems, and devices for hydrazine delivery according to certain embodiments of the present invention.

The manifold illustrated in FIG. 13 was utilized for test procedures in this Example. The Brute™ vaporizer 1306 was assembled with a PTFE splash guard on the outlet barb and a new lumen assembly. Brute™ vaporizer 1306 was filled with 200 mL of a liquid source solution comprising hydrogen peroxide and the lid was assembled. The test system 1300 was assembled as shown in FIG. 13. Manometer 1310 was connected to the display readout. All valves 1302, 1304, 1308, and 1312 were closed and vacuum pumps 1318, 1320, and 1322 were off. Cold trap bath 1316 was filled with liquid nitrogen. Outlet back pressure valve (BPV) 1304 was closed and valve 1312 was opened. Vacuum pumps 1318, 1320, and 1322 were turned on, the cold trap bath 1316 was opened, and the equilibrium pressure was recorded. Outlet BPV 1304 was quickly opened to shock vaporizer 1306 with low pressure. Observation perfluoroalkoxy (PFA) Tube 1324 was monitored for signs of droplets of the liquid source solution. Vaporizer 1306 was exposed to vacuum until the pressure was constant. Valve 1312 was turned off and the rate of rise was recorded in minute intervals. The test was repeated several times. The splash guard prevented liquid solution from entering the outlet of vaporizer 1306 at pressures below 1 torr.

EXAMPLE 4

The compatibility of additional solvents used in the methods and systems disclosed herein was investigated. Four solutions were prepared containing 65% hydrazine in diethylene glycol (Solvent 1), triethylene glycol (Solvent 2, hexamethylenetetramine (Solvent 3), and DMPU (Solvent 4). Table 1 lists the components of each test solution.

TABLE 1

65% Hydrazine Solutions

| Solvent # | Molecular Mass | Density | volume (mL) | Mass (g) | Volume of Hydrazine (mL) | Mass of Hydrazine (g) | Concentration (% w/w) |
|---|---|---|---|---|---|---|---|
| 1 | 106.12 | 1.116 | 2.64 | 2.94 | 5.36 | 5.47 | 65.0 |
| 2 | 150.17 | 1.124 | 2.63 | 2.95 | 5.37 | 5.48 | 65.0 |
| 3 | 140.19 | Solid | — | 3.30 | 6.00 | 6.12 | 65.0 |
| 4 | 128.17 | 1.06 | 2.73 | 2.89 | 5.27 | 5.37 | 65.0 |

Figure 14:
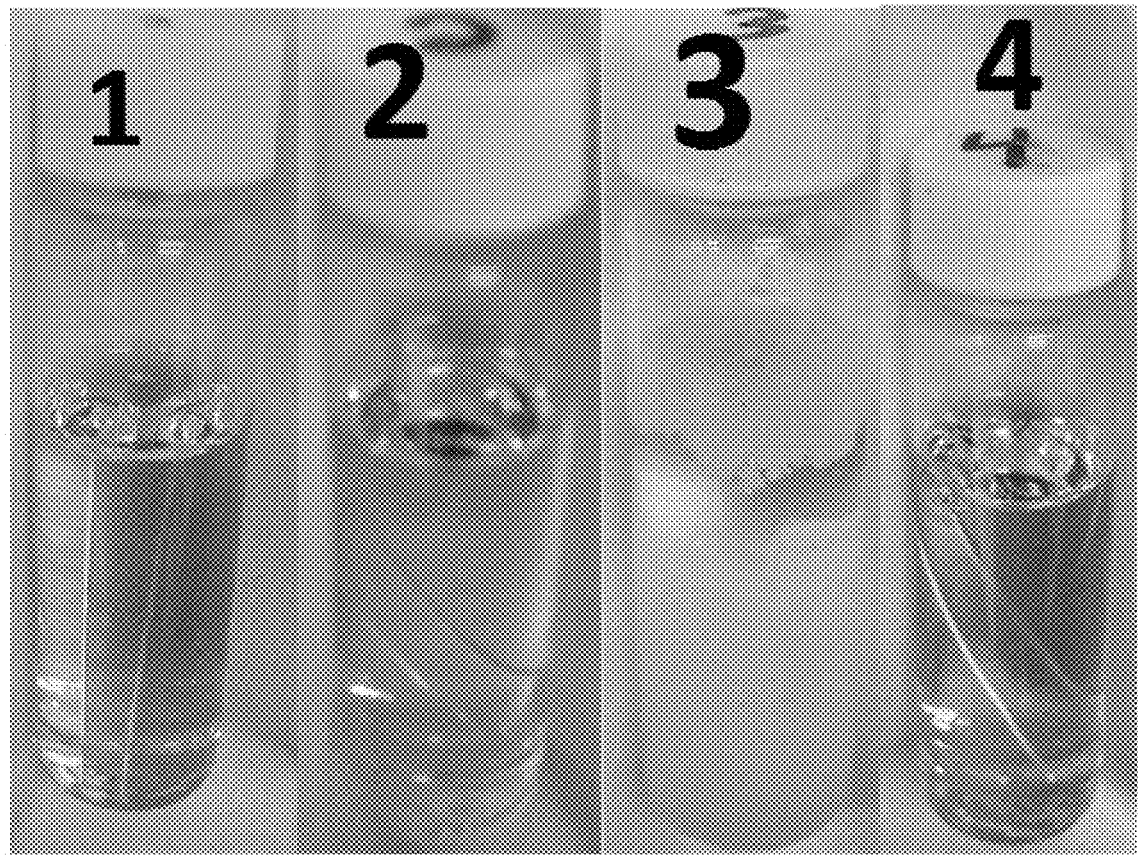
FIG. 14 is a picture of tubes containing four different non-aqueous hydrazine solutions that are useful as a liquid source according to certain embodiments of the present invention.

FIG. 14 shows pictures of each 65%-hydrazine solution after monitoring for 30 minutes. Solvents 1, 2, and 4 all formed homogenous 65 weight % hydrazine solutions immediately and without requiring agitation. However, Solvent 3 failed to dissolve in hydrazine even after vigorous shaking.

Figure 15:
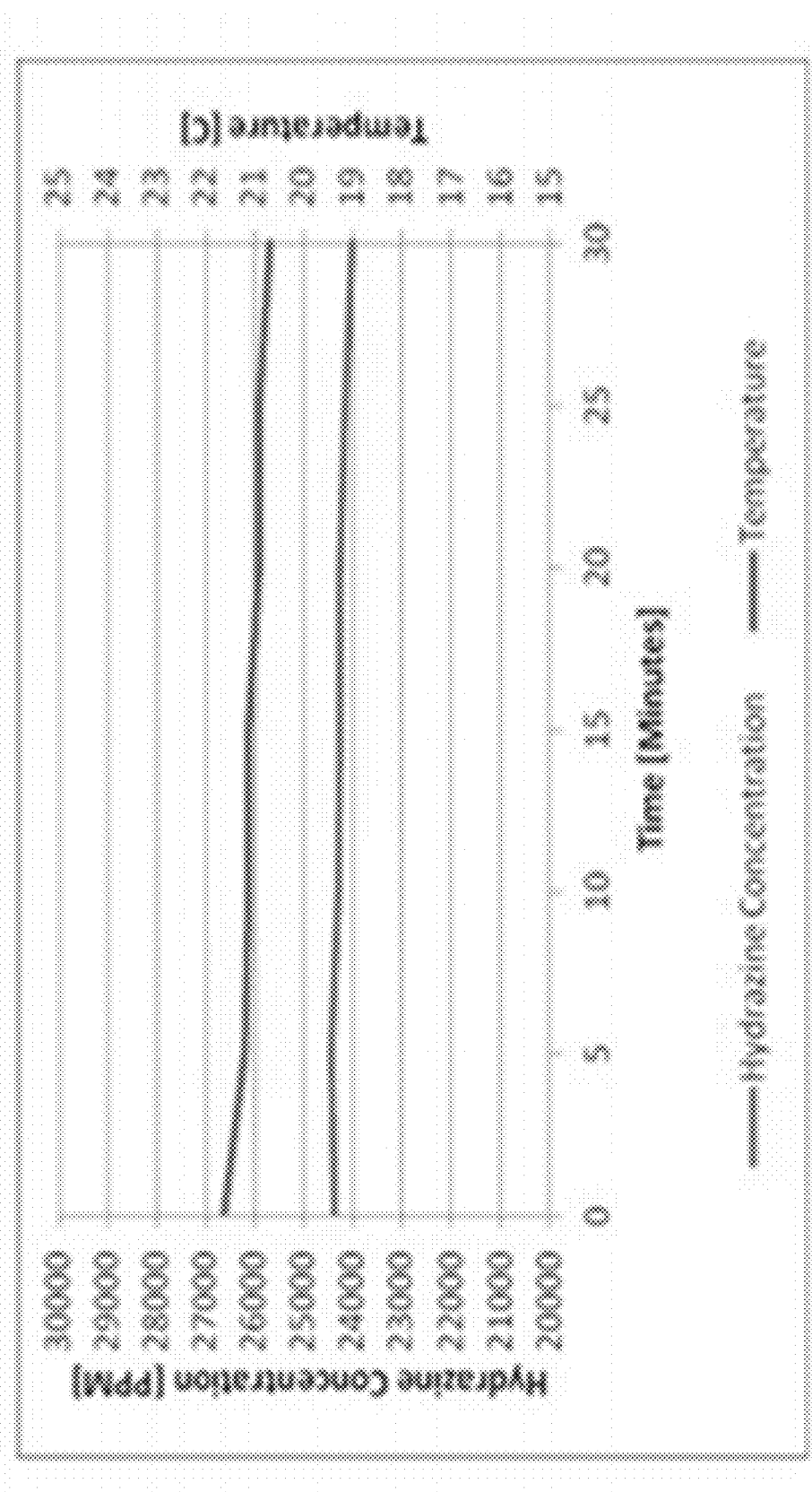
FIG. 15 is a chart depicting hydrazine gas concentration and over time according to an embodiment of the present invention, using 65% hydrazine in triethylene glycol as a liquid source.

Considering the boiling point, flash point, and NFPRA ratings of the three solvents that were miscible with hydazine, Solvent 2 was tested in an application involving the Brute™ vaporizer as described in Example 3. The hydrazine concentration was measured over time from a Brute™ vaporizer containing a 65 weight % hydrazine/35 weight % triethylene glycol solution as the liquid source. The results of this test are shown in FIG. 15, which plots the measured hydrazine concentration and temperature against time. The test was continued for 120 minutes and the average hydrazine output at 500 SCCM was about 24,600 PPM The 65% hydrazine/35% triethylene glycol solution exhibited a flash point of 90.0° C. By contrast, anhydrous hydrazine has a flash point of about 37° C.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method comprising:
   (a) providing a non-aqueous solution comprising a process chemical and a solvent in a device configured to contain a liquid and a vapor phase, wherein the non-aqueous solution has a vapor phase comprising an amount of anhydrous vapor of the process chemical;
   (b) contacting a carrier gas or vacuum with the vapor phase to form a gas stream; and
   (c) delivering the gas stream comprising the anhydrous vapor to a critical process or application,
   wherein the process chemical is hydrazine and wherein the solvent is selected from the group consisting of ethylene glycol, triethylene glycol, α-propylene glycol, β-propylene glycol, 1,3-Dimethyl-3,4,5,6-tetrahydro-2 (1H)-pyrimidinone (DMPU), 1,3-Dimethyl-2-imidazolidinone (DMEU), and tetramethylurea.

2. The method of claim 1, further comprising changing the concentration of at least one component of the vapor phase by changing at least one of the following parameters: (a) the temperature of the non-aqueous solution, (b) the pressure of the non-aqueous solution, (c) the concentration of the non-aqueous solution, (d) the temperature of the carrier gas, (e) the pressure of the carrier gas or vacuum, and (f) the flow rate of the carrier gas.

3. The method of claim 1, wherein at least one membrane is disposed in the device, the membrane being configured to at least partially separate the vapor phase from the non-aqueous solution.

4. The method of claim 3, wherein the anhydrous vapor permeates the membrane at a faster rate than any other component of the non-aqueous solution.

5. The method of claim 3, wherein the membrane is an ion exchange membrane.

6. The method of claim 1, further comprising removing contaminants from the gas stream.

7. The method of claim 1, wherein the carrier gas is selected from the group consisting of nitrogen, argon, hydrogen, clean dry air, helium, and ammonia.

8. The method of claim 1, further comprising changing the concentration of at least one component of the vapor phase by adding energy to the non-aqueous solution.

9. The method of claim 1, wherein the non-aqueous solution is a non-aqueous hydrazine solution comprising from about 25% to about 69% by weight of hydrazine.

10. The method of claim 9, wherein the non-aqueous hydrazine solution comprises from about 65% to about 69% by weight of hydrazine.

11. The method of claim 1, wherein the non-aqueous solution contains less than 0.1% water.

12. The method of claim 1, wherein the concentration of anhydrous vapor delivered in the gas stream is stable to within about 5% of the average concentration delivered.

13. The method of claim 11, wherein the non-aqueous solution contains less than 0.01% water.

14. The method of claim 13, wherein the non-aqueous solution contains less than 0.001% water.

15. The method of claim 12, wherein the concentration of anhydrous vapor delivered in the gas stream is stable to within about 3% of the average concentration delivered.

* * * * *